US012791611B2

(12) United States Patent
Jain et al.

(10) Patent No.: US 12,791,611 B2
(45) Date of Patent: Nov. 10, 2026

(54) ENHANCED DESIGN FOR TEST ARCHITECTURE TO POWER COLLAPSE DESIGN FOR TEST LOGIC

(71) Applicant: QUALCOMM Incorporated, San Diego, CA (US)

(72) Inventors: Arvind Jain, San Diego, CA (US); Vineet Ooramkumarath, San Diego, CA (US); Omid Chavoshi-Nejad, Port Moody (CA); Deepak Agrawal, San Diego, CA (US); Madan Krishnappa, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 18/591,540

(22) Filed: Feb. 29, 2024

(65) Prior Publication Data

US 2025/0277850 A1 Sep. 4, 2025

(51) Int. Cl.
*G01R 31/317* (2006.01)
*G01R 31/30* (2006.01)

(52) U.S. Cl.
CPC ... *G01R 31/31704* (2013.01); *G01R 31/3004* (2013.01); *G01R 31/31721* (2013.01)

(58) Field of Classification Search
CPC .......... G01R 31/31704; G01R 31/3004; G01R 31/31721
See application file for complete search history.

(56) References Cited

U.S. PATENT DOCUMENTS 10,955,472 B1 * 3/2021 Trock ............... G01R 31/31721
11,283,454 B2 * 3/2022 Ravid ....................... G06F 1/12
2010/0011264 A1 * 1/2010 Pugliesi-Conti ............................ G01R 31/318552 714/E11.002
2012/0191400 A1 * 7/2012 Sontakke ......... G01R 31/31724 702/119
2018/0164376 A1 * 6/2018 Ge ................... G01R 31/31721
2022/0043653 A1 * 2/2022 Acharya ............. G06F 13/1605
2024/0152178 A1 * 5/2024 Chaudhari ............ G06F 1/3237

* cited by examiner

*Primary Examiner* — Mark D Featherstone
*Assistant Examiner* — Jack Kensington Barnett
(74) *Attorney, Agent, or Firm* — NORTON ROSE FULBRIGHT US LLP

(57) ABSTRACT

This disclosure provides systems, methods, and devices for memory systems that support enhanced processing core scheduling schemes. In a first aspect, a system-on-a-chip (SoC) includes functional logic configured to perform one or more functions and self-testing logic configured to perform a self-testing operation on the functional logic. The SoC also includes a plurality of power domains, including a functional power domain coupled to the functional logic and configured to provide power to the functional logic and a self-testing power domain coupled to the self-testing logic and configured to provide power to the self-testing logic. The SoC further includes power control logic configured to control power delivery from the plurality of power domains to the functional logic and the self-testing logic and configured to power collapse the self-testing logic. Other aspects and features are also claimed and described.

20 Claims, 10 Drawing Sheets

100

ENHANCED DESIGN FOR TEST ARCHITECTURE TO POWER COLLAPSE DESIGN FOR TEST LOGIC

TECHNICAL FIELD

Aspects of the present disclosure relate generally to an apparatus and method for power collapsing self-testing logic to reduce self-testing logic power drain during normal SoC operation (e.g., during non-self-testing operations). Some aspects may, more particularly, relate to SoC self-testing design architecture to reduce overall power consumption and improve self-testing accuracy.

INTRODUCTION

System-on-a-chip (SoC) designs and devices are becoming more complex, implementing smaller physical profiles with ever-decreasing conductor path dimensions for transferring data at higher rates than predecessor SoCs. Operating at higher speeds with greater physical design constraints may increase power demands, which can increase the temperatures an SoC is subjected to during operation. Higher temperatures during testing, bootup, and normal operation can increase the risk of initialization and run-time errors within an SoC. These errors, and other errors such as those introduced in a malicious attack, may occur at higher rates when circuitry in an SoC ages or the power grid is inefficient or faulty.

To ensure SoC quality and proper functioning internal testing procedures have been developed to test the SoC after manufacturing and optionally periodically during operation. Such internal SoC testing procedure are often referred to as design for test (DFT), built-in self-test (BIST), and/or debugging. Adding self-testing to SoC enables quicker and more accurate testing of SoC for errors during the manufacturing process and over time. However, the self-testing architecture and logic take up valuable space on the SoC and may consume power during normal operation of the SoC, which reduces power efficiency.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Aspects disclosed herein describe power collapsible self-testing architecture and design. The power collapsible designs enable self-testing logic to have increased functionality, such as to be able to test more or all functional system or sub-systems thereof, and enables the self-testing logic, or a portion thereof, to be power collapsed to reduce a power consumption or power drain during non-self-testing operations or normal operations (e.g., one or more functional operations). In the aspects described herein, both dedicated and distributed self-testing power domains are described along with the corresponding SoC architecture for such designs. In addition to the architecture level designs for collapsible self-testing architecture with dedicated or collapsible self-testing logic, the aspects disclosed herein include component level designs for collapsible self-testing logic. For example, the aspects disclosed herein include a split wrapper cell design with collapsible and non-collapsible self-testing logic, a chip clock controller design with collapsible self-testing logic, an always-on wrapper cell with collapsible self-testing logic, and a memory self-testing circuit design with collapsible self-testing logic.

In one aspect of the disclosure, a system-on-a-chip (SoC) includes functional logic configured to perform one or more functions and self-testing logic configured to perform a self-testing operation on the functional logic. The SoC also includes a plurality of power domains, including a functional power domain coupled to the functional logic and configured to provide power to the functional logic and a self-testing power domain coupled to the self-testing logic and configured to provide power to the self-testing logic. The SoC further includes power control logic configured to control power delivery from a plurality of power supplies to the plurality of power domains, and thus to control power delivery to the functional logic and the self-testing logic and to power collapse the self-testing logic.

In another aspect of the disclosure, a device includes a processing system and a memory coupled to the processing system. The processing system is configured to cause the device to: supply power from a first power domain to functional logic and from a second power domain to self-testing logic; perform a self-testing operation using the functional logic and the self-testing logic; deactivate the second power domain to power collapse the self-testing logic; and perform a functional operation using the functional logic.

In another aspect of the disclosure, a method for wireless communication includes: supplying power from a first power domain to functional logic and from a second power domain to self-testing logic; performing a self-testing operation using the functional logic and the self-testing logic; deactivating the second power domain to power collapse the self-testing logic; and performing a functional operation using the functional logic.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Like reference numbers and designations in the various drawings indicate like elements.

DETAILED DESCRIPTION

Figure 1:
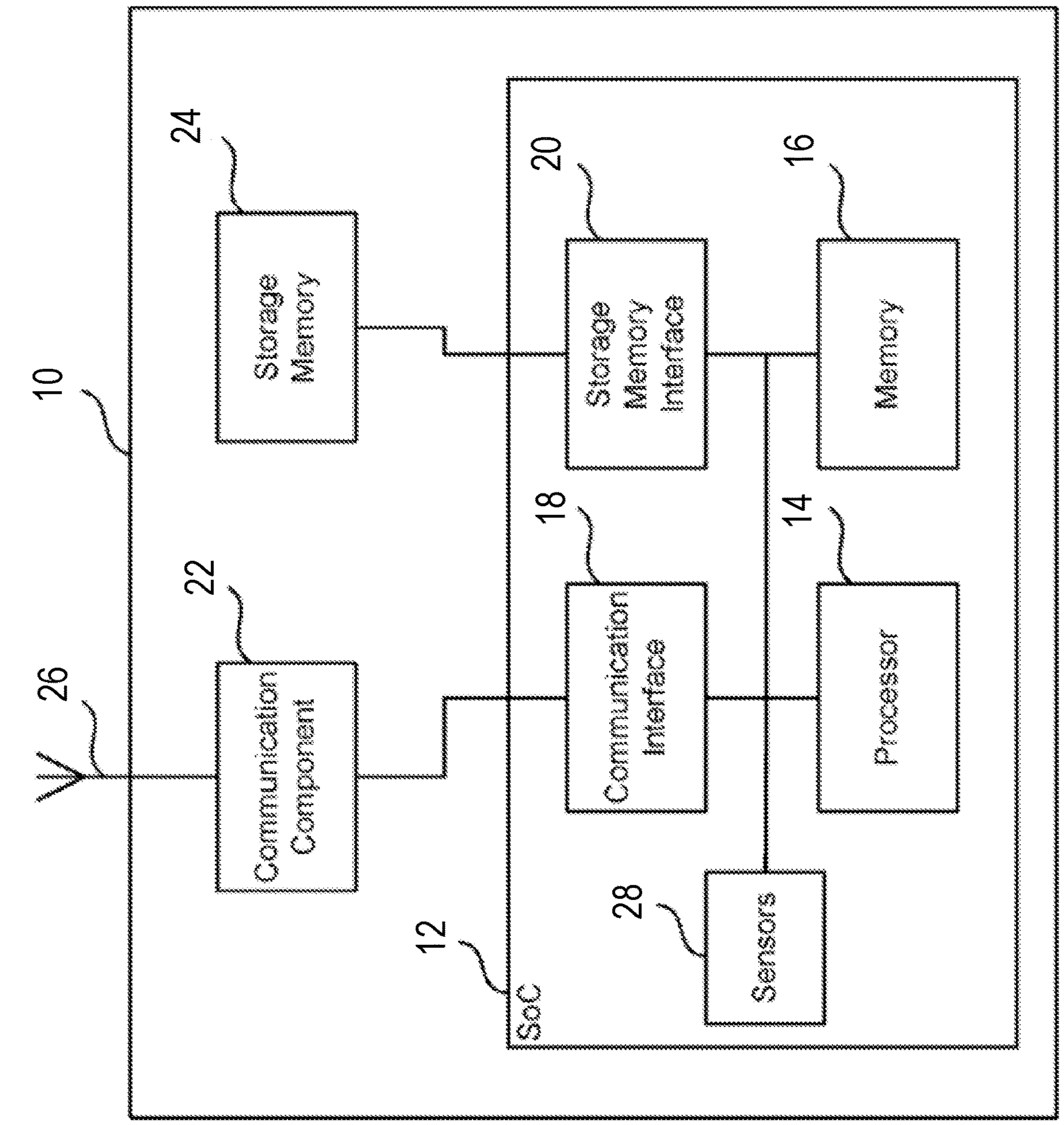
FIG. 1 is a block diagram illustrating a system including a computing device according to some aspects of the disclosure.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

The present disclosure provides systems, apparatus, methods, and computer-readable media that support power collapsible self-testing logic. Aspects of this disclosure provide architecture and component level designs for power collapsible self-testing logic. For example, a separate power domain that is distinct from a power domain which provides power to functional components may be used for some or all of the self-testing logic to enable the self-testing logic to be power collapsed when not in use. In the aspects described herein, both dedicated and distributed self-testing power domain architectures are disclosed, along with various cell and component level designs compatible with such architectures that include and enable power collapsible self-testing logic. Each power domain may be associated with a corresponding power supply which provides power to the power domain, that is a group of components which are powered by the corresponding power supply. As used herein, the power domain providing power to particular components, such as functional logic and/or self-testing logic of the power domain, corresponds to the power supply providing power to the power domain distributing the power to the components thereof.

Particular implementations of the subject matter described in this disclosure may be implemented to realize one or more of the following potential advantages or benefits. In some aspects, the present disclosure provides techniques for power collapsing self-testing logic during normal or functional (e.g., non-self-testing or debugging) operation which reduces power consumption by reducing or eliminating power leakage from the self-testing logic. For example, some or all self-testing logic may be completely disconnected from power in non testing mode and may not leak power because the self-testing logic is on another power domain which is not active during normal use and not on the power domain or domains which is receiving power from and active power supply and supplying the received power to functional logic.

Additionally, in some aspects the distributed self-testing power domain architectures disclosed herein may enable the self-testing logic to be located physically closer to the corresponding self-testing power domain and/or the corresponding functional components, which may enable easier circuit designs by reducing design challenges due to timing issues, component isolation issues, and power routing issues.

Various aspects will be described in detail with reference to the accompanying drawings. Wherever possible, the same reference numbers will be used throughout the drawings to refer to the same or like parts. References made to particular examples and embodiments are for illustrative purposes and are not intended to limit the scope of the various aspects or the claims.

The term "system-on-a-chip" (SoC) is used herein to refer to a set of interconnected electronic circuits typically, but not exclusively, including a processing device, a memory, and a communication interface. A processing device may include a variety of different types of processors 14 and processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

As used herein, the term "computing device" refers to any one or all of vehicle management systems, display subsystems, driver assistance systems, vehicle controllers, vehicle system controllers, vehicle communication system, infotainment systems, vehicle display systems or subsystems, vehicle data controllers or routers, cellular telephones, smart phones, personal or mobile multi-media players, personal data assistants (PDAs), laptop computers, personal computers, tablet computers, smart books, palm-top computers, wireless electronic mail receivers, multimedia Internet enabled cellular telephones, vehicle controllers, and similar electronic devices which include a programmable processor and memory and circuitry configured to perform operations as described herein.

For ease of reference, the term "scan chain" is used to refer to a technique used in design for testing (DFT) technologies. Scan chain testing includes techniques that allow an SoC or any other computing device having a processor to selectively activate or use all flip-flops in a scan chain layer of a design as a shift register during scan testing. A scan chain layer may be a physical layer within an SoC inserted into the stack-up of the design layout. The flip flops within a scan chain layer of an SoC are connected to combinational logic that is used to perform various functions of an SoC. A scan chain test may be used to test the functional hierarchies (e.g., CPU, GPU, etc.) of a computing device or SoC. A scan chain may include the serial grouping of a number of flip flops within a circuit design in which each flip flop contains at least two logic gates. In some embodiments, scan chain testing may include shifting data patterns into the SoC in which the flip flops within the scan chain capture the functional data that results from the test pattern, and the results of the input patterns and flip flop data capture is shifted out of the flip flops. This internal scan increases the controllability and observability of SoC logic by connecting storage cells (e.g., flip flops having two or more logic gates) into a long shift register, or scan chain, and by enhancing the logic of these cells to support a scan-shift mode that allows for serial loading and unloading of scan chain contents.

As used herein, the term "scan stitching" refers to the process in logically and/or physically (e.g., electrically) connecting flip flops to create a scan chain. Scan stitching may be implemented in a design process of an SoC or other computing device to map or "chain" together the various flip flops within a chip design. Conventional scan stitching may include serially connecting the flip flops to create a scan chain using a netlist. In some embodiments, scan stitching may be physical-aware scan stitching that orders the flip flops according to their physical location within a chip design, as opposed to using a netlist to create the scan chain. Physical aware scan stitching may include ordering the flip flops in such a way that minimizes the total physical length of the resulting scan chain for purposes of reducing DFT test time. Thermal grid-aware scan stitching refers to the process of grouping and connecting flip flops to create scan chain segments, or sections, based on a logical grid configuration of an SoC.

The term "scan chain section" as used herein refers to one flip flop or a series of flip flops for performing scan chain testing. In some embodiments, a scan chain section may be a reconfigured or redesigned section or portion of a scan chain within a scan chain layer. For example, the scan chain may be reconfigured into multiple standalone scan chain sections during the design phase of a computing device. For example, a pre-fabrication scan chain may be organized via physical-aware scan-stitching, and then separated into scan chain sections (i.e., separate groups of flip flops) that may be activated and tested individually, each section having test data inputs and outputs.

As used herein, the term "flip flop" refers to a circuit that has two stable states and can be used to store state information. A flip flop may include at least two logic gates to perform storage functions. A group of at least two flip flops in a series configuration may be used as a shift register to shift state information bit by bit serially through the flip flops. In some embodiments, a flip flop may be referred to as a latch.

As used herein, the term "spatially" may refer to the physical orientation and/or location of a system component or area within the physical layout and stack-up or a computing device. For example, a group of flip flops may be referred to as being spatially associated with a grid portion of an SoC, where an SoC is logically divided into various portions with respect to the SoC physical layout and/or stack-up. A group of flip flops may be spatially associated with a grid portion such that the group of flips flops may be physically located within the logical boundaries of the grid portion. As another example, a group of flip flops, or a group of logic gates, may be spatially associated with a scan chain section, and therefore the scan chain section may be spatially associated with a corresponding grid portion that is spatially associated with the group of flip flops.

As used herein, the term "grid portion" refers to a physical portion of an SoC in three-dimensional space. For example, a grid portion may be a volume of an SoC fabrication, in which the grid portion is distinct from other grid portions as arranged in a top-down view of the SoC fabrication. A grid portion may include one or more SoC stacks or layers, or a portion of one or more stacks or layers within an SoC. In some embodiments, a grid portion may be referred to as a region of an SoC. In some embodiments, a portion of the SoC may not be a grid portion, but may be a physical portion of the SoC having a defined volume and/or shape distinct from a grid configuration. For example, a portion of the SoC may be dimensionally rectangular, or may be any other shape and volume as determined in a design stage of an SoC. Thus, an SoC may be logically divided into any number of portions, or regions, each having any variety of volumes, such that a single SoC may be logically divided into at least two portions.

Various embodiments include methods, system-on-a-chip (SoC) designs, processing devices, and memory that are configured to implement the methods for monitoring in-field characteristics of an SoC. Various embodiments may be configured to monitor in-field characteristics by implementing a scan chain to sequentially input test data into groups of logic gates corresponding to physical regions of an SoC, and by measuring on-chip thermal, IR drop, and power-grid reliability in response to the scan chain inputting test data.

Continuous and in-field monitoring of on-chip thermal characteristics, IR drop, and power grid reliability is an important safety and security requirement in certain types of systems, processors and SoCs. These in-field characteristics may be especially critical in systems where human safety is a priority, such as automotive vehicle systems. Failure or unexpected degradation (e.g., through excessive IR drop, power grid degradation, electromigration, etc.) of an SoC controlling safety features or other features for normal operation may occur with too little or no warning of an impending failure or error.

Existing sensors, such as temperature and voltage sensors, positioned throughout the physical profile of an SoC can provide read outs of the temperature and voltage values under a given workload. However, execution of a typical workload performing common operations may not exercise remote and discretized logic in the SoC sufficient to enable in-service monitoring of all regions of the SoC. For example, a workload may include functional data patterns activating combinational logic corresponding to a GPU, which may create power demands within a region of the SoC including the GPU for a certain period of time. As another example, a workload may include functional data patterns activating combinational logic corresponding to a CPU, which may create power demands within a different region of the same SoC for a period of time. While any one workload functional pattern is being implemented, the remaining portions of the SoC may be inactive or may not fully utilize the extent of the combinational logic for specific SoC functions. Thus, conventional workloads may not be able to provide rigorous enough power draw (i.e., sufficient temperature conditions) to uncover, or highlight, potential issues within an SoC that may be caused by thermal and electrical conditions. Thus, measuring temperature and voltage values under conventional workloads may not help in isolating and specifically identifying an exact reason for an SoC error or failure (e.g., aged power delivery network, increased IR drop values, on-chip or off-chip power attacks, hard errors, etc.).

Conventional scan chain testing seeks to provide more rigorous testing of an SoC as compared to functional workloads during normal operations. Conventional scan chains typically activate all of the flip flops within a scan chain layer simultaneously, causing all of the associated combinational logic to be activated simultaneously in response. As such, measuring thermal and electrical characteristics during the scan chain activation may provide some insight as to potential overarching issues within an SoC (e.g., thermal "hot spots," power constraints). However, because conventional scan chains are activated in an all-or-nothing manner, conventional scan chains may not allow for identifying specific sources of any observed problems or out-of-limit conditions. For example, activating a conventional scan chain may enable detecting a thermal hot spot; however, the specific circuitry within the SoC causing the thermal issue may not be identifiable based on conventional scan chain activations.

Various embodiments address safety and security considerations through continuous and in-field monitoring of on-chip thermal, power distribution network, and power grid reliability. Various embodiments may identify errors or failures associated with aging of the power grid on the SoC, which over time can lead to in-field functional failures due to poor voltage delivery. Various embodiments may identify trojans or hard attacks, which can cause high power leakage paths or burnouts when a particular logic gate is activated. Various embodiments may further characterize the thermal paths from individual gates to the rest of the SoC to confirm expected operation and no presence of off-chip influences (e.g., a redistribution layer).

Various embodiments include an SoC design particularly suitable for safety and security critical applications. For example, various embodiments may include circuitry, mechanisms, and methods for activating a selected and specific portion of an SoC design while operating in the field. Various embodiments may include circuitry and mechanisms to detect any changes in the SoC power delivery network (or power grid), such as caused by aging or attacks, by capturing the electrical response within the SoC caused by activating a specific design segment within the SoC. As another example, some embodiments may include circuitry and mechanisms to detect changes in the thermal path (i.e., on and off chip) by capturing the thermal response after activating a specific design segment within the SoC. As a further example, some embodiments may include circuitry and mechanisms to detect any trojans or hard fails in the design during in-field operation.

Various embodiments include separating a scan chain design into multiple sections, and clock gating each individual section. Separating a scan chain design into multiple sections may allow for the creation and testing of highly localized, power-dense regions on an SoC. By powering and/or activating each scan chain section separately, sequentially, or in any other configuration, various embodiments enable measuring the thermal and electrical responses present in other unpowered and/or inactive sections within the SoC. This allows in-field testing to isolate potential issues (e.g., aged power delivery network, increased IR drop values, on-chip or off-chip power attacks, hard errors, etc.) based on the responses measured throughout an SoC resulting from each individually activated scan chain section.

In some embodiments, a scan chain may be divided into separate logically located grid sections corresponding to a physical profile of an SoC. For example, during the physical design stage of an SoC, the physical profile of the SoC may be decomposed into a grid having different grid portions. Each grid portion may be logically overlaid on top of the SoC physical profile, such that each logical grid portion may be associated with circuitry within the corresponding physical area of the SoC. Thus, the flip flops of a scan chain layer may be separated similarly based on a grid configuration in which each portion of the grid may be associated with a number of flip flops. The flip flops in each grid may be chained-or stitched-together to create a single scan chain section, or segment, in which each segment may be activated individually to produce and measure a thermal and electrical responses at each other segment of the grid-based scan chain. Thus, thermal grid-aware scan stitching may stitch together flip flops for the purpose of determining thermal characteristics in a grid or grid-like configuration.

The grid-based scan chain segments may be clocked to individually activate each scan chain segment for purposes of measuring the corresponding responses at each other grid portion. For example, a scan chain layer may be designed to include clock gates before and after each portion of the grid (i.e., to isolate each scan chain segment). This allows for the gating of the clock propagation to downstream and upstream logic (i.e., the other flip flops in other portions of the grid and their associated combinational logic). Thus, various embodiments may provide a clock signal to a single group of flip flops associated with a grid portion, while gating the clock signal from other flip flops associated with other grid portions.

After design and tape-out, each clock gate associated with each grid portion may be serially chosen and activated through software to sequentially activate each chain of corresponding flip flops. For example, clocking one grid portion (i.e., the flip flops physically associated with that logical grid portion) may produce responses that are measurable by temperature and voltage sensors in other grid portions that have their clocks gated. Each portion of the grid may be sequentially activated by a clock gate controller to allow the SoC to determine the responses at each clocked-gated grid portion. The temperature and voltage measurements may be used for system characterization to identify potential issues caused by the clocked flip flops associated with an activated grid portion. In some embodiments, the thermal and electrical characteristics of an activated grid portion may be measured individually, or along with other grid portions that have their clocks gated. Thus, a scan-chain grid configuration can enable measuring thermal and electrical responses across any combination of grid portions, clocked or clock-gated, in response to activating any individual grid portion or any combination of grid portions. For example, one grid portion may be activated and thermal and electrical responses may be measured across the activated grid portion, another individual grid portion, multiple different grid portions, or all grid portions simultaneously.

In some embodiments, the clock signaling used to activate each individual grid portion, or scan chain section, may be a high-speed clock signal (e.g., turbo-shifted clock, 3.2 GHz clock). Shifting the data input into each group of flip flops at high frequencies can cause the SoC to draw power at levels higher than in normal operations (referred to herein sometimes as "high power") to implement the combinational logic associated with each clocked flip flop. By increasing the power requirements for shifting data into the flip flops at high speeds, thermal and electrical responses produced at other sections of the SoC may be more readily measurable, and therefore any associated errors or attacks may be more easily identifiable. Thus, various embodiments enable briefly activating individual grid portions while characteristic measurements (e.g., temperature, voltage, current, etc.) are obtained in other grid portions, and rapidly repeating this process for many or all individual grid portions so that measured characteristics are consistent on average with normal operations (in which many grids are activated) while enabling changes in measurements to be associated with particular one or few grid portions. This capability enables potential performance of life-limiting issues that occur during normal operation to be detected while at the same time enabling the sources of such issues to be localized to one or a few grid portions.

FIG. 1 illustrates a system including a computing device 10 suitable for use with various embodiments. The computing device 10 may be included in a mobile computing device, such as a wireless communication device, according to one or more aspects of the disclosure. As other examples, the computing device 10 may be included in an MP3 player, a laptop computer, or a non-portable electronic device such as a desktop computer, a game player, a television (TV), a media player, or an automotive computer system. The computing device 10 may include an SoC 12 with a processor 14, a memory 16, a communication interface 18, a storage memory interface 20, and sensors 28. The computing device 10 may further include a communication component 22, such as a wired or wireless modem, a storage memory 24, and an antenna 26 for establishing a wireless communication link. The processor 14 may include any of a variety of processing devices, for example a number of processor cores.

An SoC 12 may include one or more processors 14. The computing device 10 may include more than one SoC 12, thereby increasing the number of processors 14 and processor cores. The computing device 10 may also include processors 14 that are not associated with an SoC 12. Individual processors 14 may be multicore processors. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster. The processors 14 may control the general operations of SoC 12 and optionally the specific actions of any of the components thereof. The processors 14 may be implemented, for example, with a microprocessor or a central processing unit (CPU), or an application-specific integrated circuit (ASIC).

The memory 16 of the SoC 12 may be a volatile or non-volatile memory configured for storing data and processor-executable code for access by the processor 14. The computing device 10 and/or SoC 12 may include one or more memories 16 configured for various purposes. One or more memories 16 may include volatile memories such as random access memory (RAM) or main memory, or cache memory. As illustrative examples of volatile memories, the one or more memories 16 may include a dynamic random access memory (DRAM) and a static random access memory (SRAM), or a non-volatile memory device, such as a read only memory (ROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (SCRAM), or a NAND flash memory. These memories 16 may be configured to temporarily hold a limited amount of data received from a data sensor or subsystem, data and/or processor-executable code instructions that are requested from non-volatile memory, loaded to the memories 16 from non-volatile memory in anticipation of future access based on a variety of factors, and/or intermediary processing data and/or processor-executable code instructions produced by the processor 14 and temporarily stored for future quick access without being stored in non-volatile memory.

The memory 16 may be configured to store data and processor-executable code, at least temporarily, that is loaded to the memory 16 from another memory device, such as another memory 16 or storage memory 24, for access by one or more of the processors 14. The data or processor-executable code loaded to the memory 16 may be loaded in response to execution of a function by the processor 14. Loading the data or processor-executable code to the memory 16 in response to execution of a function may result from a memory access request to the memory 16 that is unsuccessful, or a "miss," because the requested data or processor-executable code is not located in the memory 16. In response to a miss, a memory access request to another memory 16 or storage memory 24 may be made to load the requested data or processor-executable code from the other memory 16 or storage memory 24 to the memory 16. Loading the data or processor-executable code to the memory 16 in response to execution of a function may result from a memory access request to another memory 16 or storage memory 24, and the data or processor-executable code may be loaded to the memory 16 for later access.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24. The storage memory interface 20 may include or correspond to a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, or a memory stick.

The sensors 28 may be communicatively coupled to the processor 14, the memory 16, the communication interface 18, and the storage memory 20 via a bus or other communication link. The sensors 28 may include thermal sensors and/or voltage sensors physically located within the SoC 12. The sensors 28 may measure thermal and electrical characteristics (e.g., temperature and voltage values) throughout the SoC 12 during testing and normal operating procedures as described by embodiments. Temperature values and voltage values measured by the sensors 28 may be conveyed to the processor 14 for processing, stored in the memory 16, and/or conveyed from the SoC 12 through the communication interface 18 to other components in the computing device 10.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device 10. For example, the communication interface 18 may be used to convey measured in-field characteristics to the communication component 22. The communication component 22 may relay the measured in-field characteristics to external additional computing devices for purposes of diagnosing any errors based on the in-field characteristics. Similarly, the memory 16, storage memory interface 20, and storage memory 24 may store and convey the measured in-field characteristics and other associated data as according to the various embodiments.

Figure 2:
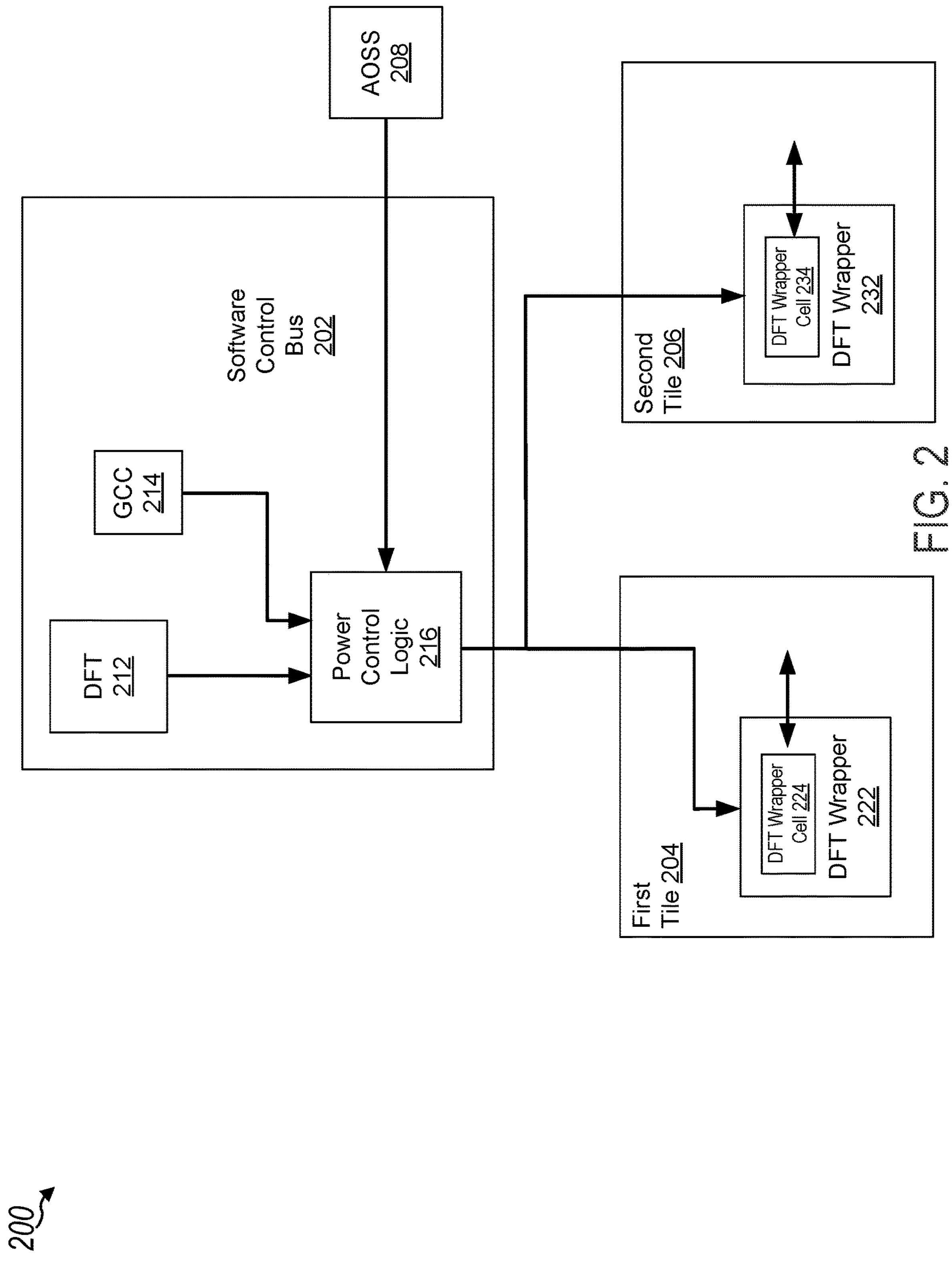
FIG. 2 is a block diagram illustrating an example of a self-testing architecture according to some aspects of the disclosure.

FIG. 2 is a block diagram 200 illustrating an example of self-testing architecture for a circuit or system, such as the SoC of FIG. 1 and/or any components thereof. In FIG. 2, the self-testing architecture is embedded in one or more tiles of multiple tiles of the circuit or system. For example, a tile of the system or circuit includes self-testing logic to test and/or debug the functional logic thereof.

Block diagram 200 of FIG. 2 depicts an example of circuit architecture which has a dedicated self-testing power logic which is powered by an always-on or primary power supple, such as (always-on subsystem) AOSS 208. In FIG. 2, the functional and self-testing logic are both powered by the primary power supply to ensure that the testing logic is powered on for testing and debugging, and that the integrated or embedded self-testing logic is not powered off and does not prevent functionality during normal operation (e.g., functional operation).

In the example of FIG. 2, the circuit architecture includes a software control bus 202, a first tile 204, a second tile 206, and an always on power supply, AOSS 208. Although two tiles are illustrated for simplicity, the circuit architecture may include more tiles. Additionally, although a single power supply and corresponding power domain are illustrated in the example of FIG. 2, the circuit architecture may include more power supplies and domains, such as dedicated self-testing power supplies and domains, such as illustrated and described with reference to FIGS. 3 and 4. Such dedicated self-testing power domains may reduce power leakage of embedded self-testing logic during normal functional operations by enabling the self-testing logic to be power collapsed, such as disconnected from a power source. Because self-testing logic may take up or account for significant logic or circuit space, such as 5 percent, preventing or reducing power leakage from self-testing components may reduce overall power consumption by a three percent in some designs.

The software control bus 202 includes DFT logic 212, global clock controller (GCC) logic 214, and power control logic 216. The logic 212-216 may include components, such as registers and circuitry configured to provide software control to other logic of the system, such as tiles 204 and 206. The DFT logic 212 may generate commands for self-testing operations of the tiles, such as the first tile 204 and the second tile 206, including for DFT operations and/or debugging operations. The DFT logic 212 may be configured to perform inward-facing testing (e.g., INTEST mode testing) or outward-facing testing (e.g., EXTEST mode testing).

The GCC logic 214 may generate clock signals and/or commands for functional operations of the tiles, such as the first tile 204 and the second tile 206, including for normal or non-self testing operations. The power control logic 216 may generate commands for operations of the tiles, such as the first tile 204 and the second tile 206, including for functional and self-testing operations and may control or route power received from the AOSS 208 to circuitry/logic of other tiles.

The first tile 204 may include or correspond to functional tile, and one or more of the functional components of FIG. 1. In some implementations, the first tile 204 may include self-testing logic and functional logic. As illustrated in FIG. 2, the first tile 204 includes DFT wrapper logic 222 for functional logic, and the DFT wrapper logic 222 (e.g., first DFT wrapper logic) includes one or more DFT wrapper cells, such as DFT wrapper cell 224 (e.g., first DFT wrapper cell).

Similarly, the second tile 206 may include self-testing logic and functional logic. As illustrated in FIG. 2, the second tile 206 includes DFT wrapper logic 232 for functional logic, and the DFT wrapper logic 232 (e.g., second DFT wrapper logic) includes one or more DFT wrapper cells, such as DFT wrapper cell 234 (e.g., second DFT wrapper cell). In the example of FIG. 2, the self-testing logic and functional logic of the tiles is provided by the AOSS 208.

The AOSS 208 includes a single primary or always-on power supply, and the AOSS is configured to supply power to one or more power domains. In the example of FIG. 2, the AOSS 208 supplies power to the power control logic 216 which provides power to the tiles, 204 and 206. Each tile then distributes the power to the self-testing logic (e.g., DFT logic and wrapper cell) and to the functional logic as illustrated. In the example, of FIG. 2, the power on the tiles 204, 306 is first provided to the self-testing logic and then provided to the functional logic, as the self-testing logic correspond to a wrapper cell which is placed around and/or prior to the functional logic to enable testing of the functional logic.

Figure 3:
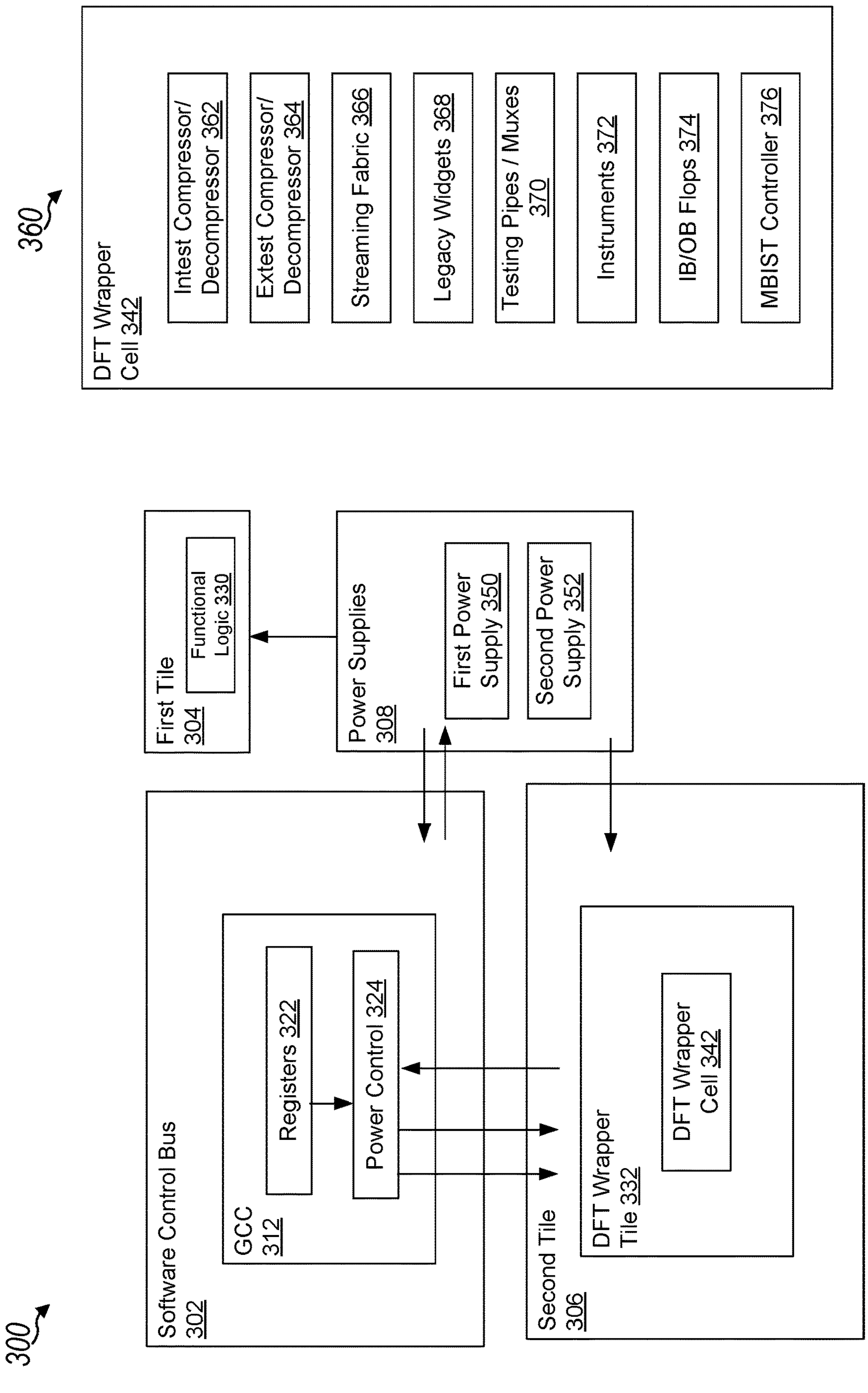
FIG. 3 is a block diagram illustrating an example of a self-testing architecture with a dedicated self-testing power domain for power collapsible self-testing logic according to some aspects of the disclosure.

FIG. 3 is a block diagram 300 illustrating an example of dedicated power architecture for self-testing logic of a circuit or system. In FIG. 3, the dedicated power architecture includes a single, separate power domain for self-testing logic. The single, separate power domain for self-testing logic may include a single power domain for internal testing (e.g., testing after manufacture) and for debugging (e.g., testing after or during operation), or may include a dedicated power domain for internal testing (e.g., testing after manufacture) and another separate, dedicated power domain for debugging (e.g., testing after or during operation). Additionally, or alternatively, the dedicated power domain for self testing may be located on a single tile, or a dedicated power domain for self testing may be located on each tile. Each power domain main have a dedicated and corresponding power supply to which it can be coupled to receive power.

Block diagram 300 of FIG. 3 depicts a circuit architecture which has a dedicated self-testing power domain architecture that is separate from a functional power domain, such as a primary or always-on power domain. Alternatively, the power domain used for self-testing may include or correspond to a lesser-on power domain as compared to one or more other power domains, such as a primary or always-on power domain. The circuit architecture may include one or more components as illustrated in FIGS. 1 and 2, such as multiple tiles of functional and/or self-testing logic, a control bus, and a plurality of power supplies. In the example of FIG. 3, the circuit architecture includes a software control bus 302, a first tile 304 (e.g., a logic tile), a second tile 306 (e.g., a DFT tile), and a plurality of power supplies 308. Although two tiles are illustrated for simplicity, the circuit architecture may include more tiles. Additionally, although two power supplies and domains are illustrated in the example of FIG. 3, the circuit architecture may include more power supplies and/or domains or fewer power supplies and/or domains in other examples, such as illustrated and described with reference to FIG. 4.

The software control bus 302 includes GCC logic 312. The GCC logic 312 includes one or more registers 322, such as control and status registers (CSRs), and power control logic 424. The registers 322 may store data for operations by the GCC logic 312, such as power control operations performed by the power control logic 324. The GCC logic 312 may generate commands for operations of the tiles, such as the first tile 304 and the second tile 306, including for DFT operations. The software control bus 302 may be configured to activate and deactivate power supplies and power domains. For example, the software control bus 302 may be configured to power up or activate the power supplies and may be further configured to connect the power supplies to the power domains to provide (route or enable) power to the power domains from the corresponding power supply. Providing power to a power domain enables the power domain to distribute power to the components thereof. Deactivating an entire power supply and/or disconnecting a power domain from a power supply may reduce power leakage and waste as compared to powering off individual components of a power domain.

The first tile 304 may include or correspond to functional tile, such as by including functional logic 330, and may correspond to one or more of the functional components of FIG. 1, such as any of components 14-20 or 28 of the SoC 12 and/or the communication component 22 or storage memory 24. In some implementations, the first tile 304 may include self-testing logic, such as self-testing attached in an architecture similar to the second tile 306 or a second tile 406 of FIG. 4. In other implementations, the first tile 304 may not include any self-testing logic or may include self-testing logic that is powered by a primary power supply, such as always on power source or supply. The first tile 304 may include or correspond to a primary power domain or both the primary power domain and a second power domain. For example, the first tile 304 may only include functional logic of the first power domain and powered by the first power supply 350, or may include the functional logic and self-testing logic of a second power domain and powered by the second power supply 352.

As illustrated in FIG. 3, the second tile 306 includes a dedicated power domain for self-testing logic (e.g., logic powered by a dedicated self-testing power domain, such as second power supply 352). For example, the second tile 306 includes a DFT wrapper tile 332, and the DFT wrapper tile 332 may include one or more wrapper cells. To illustrate, the DFT wrapper tile 332 includes at least one wrapper cell, such a DFT wrapper cell 342 (e.g., first DFT wrapper cell) as illustrated in the example of FIG. 3. Although one DFT wrapper cell is illustrated in the example of FIG. 3, in other examples the DFT wrapper tile may include multiple DFT wrapper cells (e.g., a second DFT wrapper cell, a third DFT wrapper cell, etc.). Illustrative examples of DFT wrapper cells and other collapsible DFT component level logic architecture are illustrated and described further with reference to FIGS. 5-8. The second tile 306 includes or corresponds both the primary power domain and the second power domain. For example, the second tile 306 includes functional logic of the first power domain and powered by the first power supply 350 and includes the self-testing logic of the second power domain and powered by the second power supply 352.

The plurality of power supplies 308 includes multiple distinct power supplies, such as a first power supply 350 and a second power supply 352. The first power supply 350 may include or correspond to a functional power supply, such as primary or always-on power supply. The second power supply 352 may include or correspond to a self-testing or lesser-on power supplies as compared to the first power supply 350. A lesser-on power supply may include or correspond to a power supply that is not always on, and is only on for some modes, and/or on less than with respect to one or more other power supplies. A self-testing or lesser-on power supply may include a power supply that provides power to logic/circuit components which perform self-testing and/or debugging, and may not provide power to logic/circuit components which perform functional operations.

In the example of FIG. 3, the first tile 304 and other logical or functional tiles may be powered by a first power supply (e.g., a primary power supply, an always on power supply, etc.). Optionally, the first tile 304 is also powered by one or more additional power supplies, such as one or more self-testing (e.g., DFT) power supplies and corresponds to one or more power domains.

The second tile 306 may be powered by two or more power supplies. In the example of FIG. 3, the DFT wrapper cell(s) of a DFT wrapper tile are powered by a separate, dedicated power supply. For example, the second tile 306 may be powered by the second power supply 352 (e.g., a self-testing or lesser-on power supply, such as a collapsible DFT power supply). In some other examples of the example of FIG. 3, the DFT wrapper cells of each DFT wrapper tile may be powered by a separate, corresponding power supply. For example, the DFT wrapper cell 342 is powered by the second power supply 352 (e.g., a first self-testing power supply) and a second wrapper cell of the DFT wrapper tile 332 is powered by a third power supply (e.g., a second self-testing power supply). In both examples, functional components of the second tile 306 may be powered by a primary or always-on power supply, such as the first power supply 350.

During operation, the software control bus 302 may coordinate or control functional operations by the tiles, DFT operations by the tiles, or a combination thereof. For example, the software control bus 302 may activate the first power supply 350 and/or control power delivery in the first power supply 350 to power components for functional operations. As another example, the software control bus 302 may activate multiple power supplies (e.g., the first power supply and the second power supply) and corresponding power domains and/or control power delivery in the activated power domains to power components for self-testing operations, such as DFT, MBIST, and/or debugging operations with power received from the activated power supplies. Activation of power supplies may include powering up the power supply and/or connecting the power supply to the corresponding power domain. Similarly, activating power domains may correspond to coupling the power domain to its power supply (e.g., opening a gate or gates), while deactivating or collapsing a power domain may correspond to decoupling the power domain from its power supply (e.g., closing a gate or gates).

Figure 4:
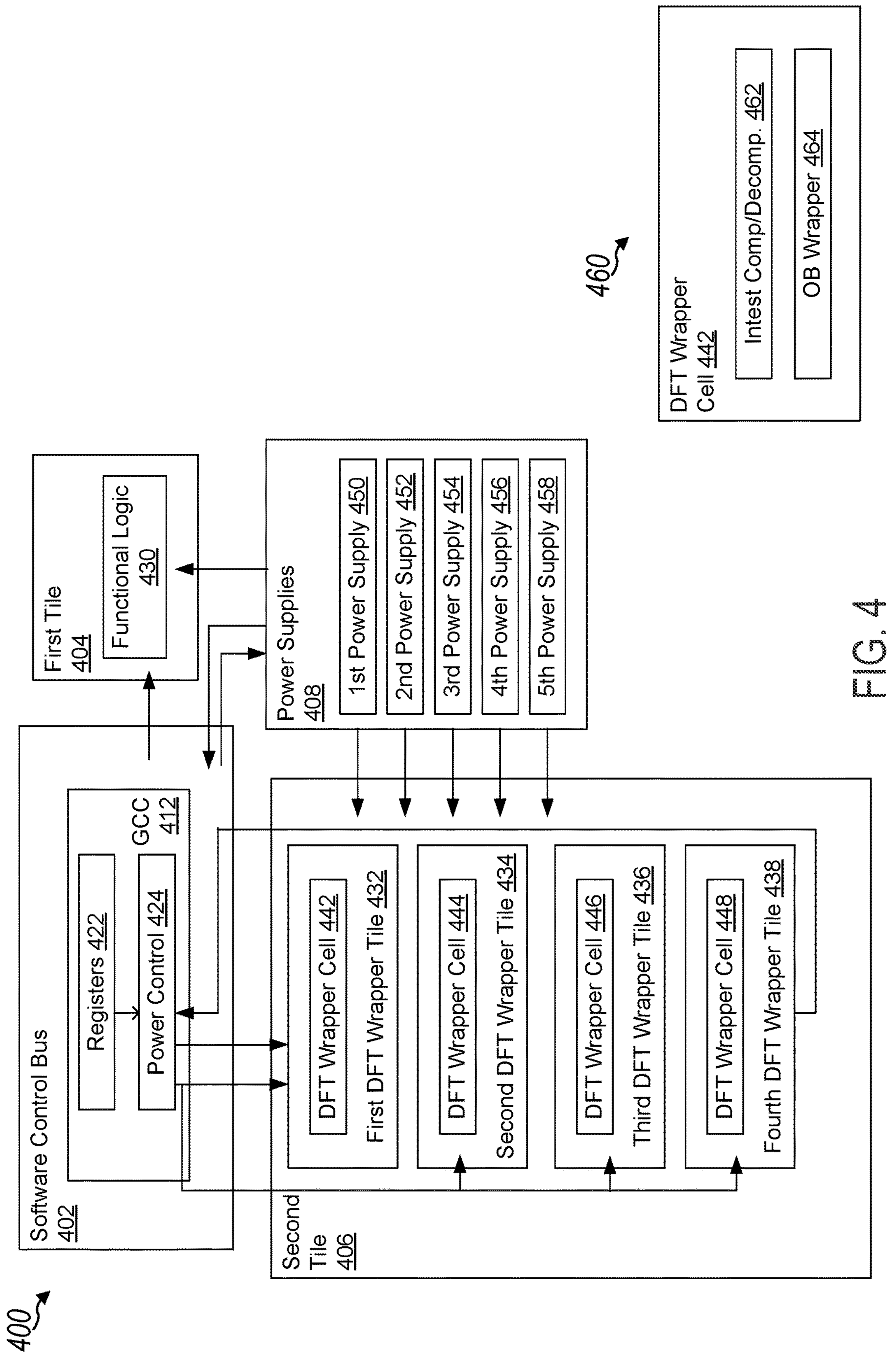
FIG. 4 is a block diagram illustrating an example of a self-testing architecture with distributed self-testing power domains for power collapsible self-testing logic according to some aspects of the disclosure.

Although a dedicated architecture for self-testing power supplies/domains is illustrated in the example of FIG. 3, in other implementations other types of a self-testing power supply/domain architectures may be used. For example, FIG. 4 depicts an example of a distributed self-testing power supply/domain architecture.

FIG. 3 also depicts an example 360 of the DFT wrapper cell 342 of the second tile 306. Specifically, the example 360 illustrates examples components, such as components 362-376 or logic of a DFT wrapper cell. In the example 360 of the DFT wrapper cell 342, the DFT wrapper cell 342 of the DFT wrapper tile 332 includes various type of logic, such as intest compressor/decompressor 362, extest compressor/decompressor 364, streaming fabric 366 (e.g., scan streaming fabric logic), legacy widgets 368, testing pipes and multiplexers 370, instruments 372, inbound/outbound flops 374, a MBIST controller 376, or a combination thereof.

The intest compressor/decompressor 362 includes or corresponds to compression and decompression logic (e.g., EDT logic) for compressing and decompressing test data associated with perform inward-facing testing. The extest compressor/decompressor 364 includes or corresponds to compression and decompression logic (e.g., EDT logic) for compressing and decompressing test data associated with perform external-facing testing. The streaming fabric 366 (e.g., scan streaming fabric logic) includes or corresponds to logic which is configured to carry and distribute test data and test signals throughout the circuit. The legacy widgets 368 includes various types of logic used during internal and external-facing testing. The testing pipes and multiplexers 370 includes or corresponds to logic for routing and providing data and signals used during internal and external-facing testing. The instruments 372 include or correspond to logic for interpreting or measuring data and signals used during internal and external-facing testing. The inbound/outbound flops 374 include or correspond to floating point operation logic for internal and external-facing testing. The MBIST controller 376 includes memory testing logic for memory devices or cells of the circuit.

Although the example 360 of FIG. 3 depicts a particular combination of components, a DFT wrapper cell may include other combinations of such components and other components in other examples. An additional example of a DFT wrapper cell is illustrated in FIG. 4, and examples of component level architecture for DFT wrapper tiles and cells are illustrated and described with reference to FIGS. 5-8.

Referring to FIG. 4, FIG. 4 is a block diagram 400 illustrating an example of distributed architecture of self-testing logic of a circuit or system. In FIG. 4, the distributed architecture includes multiple power domains for self-testing logic. As compared to the example architecture of FIG. 3, which includes a single power domain for the self-testing power domain, which is separate from a primary or other functional power domains, the example architecture of FIG. 4 includes multiple self-testing power domains. Utilizing multiple self-testing power domains (also referred to as power islands), may enable the DFT logic and power logic to be located physically closer to each other and to the functional logic it is designed to test. Such designs may be more complicated than the single self-testing power domain architecture design of FIG. 3, but may reduce timing issues and routing issues that may occur when a single domain is used to provide power to a single self-testing power domain to test all functional circuit, because some functional or self-test circuitry will be located further from the self-testing logic of self-testing power domain than others.

Block diagram 400 of FIG. 4 depicts a circuit architecture which has a distributed self-testing power domain architecture and includes multiple self-testing power domains and corresponding self-testing power supplies. The circuit architecture may include one or more components as illustrated in FIGS. 1 and 2, such as multiple tiles of functional and/or self-testing logic, a control bus, and a plurality of power domains. In the example of FIG. 4, the circuit architecture includes a software control bus 402, a first tile 404 (e.g., a logic tile), a second tile 406 (e.g., a DFT tile), and a plurality of power supplies 408. Although two tiles are illustrated for simplicity, the circuit architecture may include more tiles. Additionally, although five power domains are illustrated in the example of FIG. 4, the circuit architecture may include more power domains or fewer power domains in other examples.

The software control bus 402 includes GCC logic 412. The GCC logic 412 includes one or more registers 422, such as control and status registers (CSRs), and power control logic 424. The registers 422 may store data for operations by the GCC logic 412, such as power control operations performed by the power control logic 424. The GCC logic 412 may generate commands for operations of the tiles, such as the first tile 404 and the second tile 406, including for DFT operations. To illustrate, the power control logic 424 may activate power supplies and corresponding domains for powering and controlling the self-testing operations and/or functional operations. For example, the software control bus 402 (e.g., the power control logic 424 thereof) may be configured to power up or activate the power supplies and may be further configured to connect the power supplies to the power domains to provide (route or enable) power to the power domains from the corresponding power supply. Providing power to a power domain enables the power domain to distribute power to the components thereof. Deactivating an entire power supply and/or disconnecting a power domain from a power supply may reduce power leakage and waste as compared to powering off individual components of a power domain.

The first tile 404 may include or correspond to functional tile and include functional logic 430, and may correspond to one or more of the functional components of FIG. 1, such as any of components 14-20 or 28 of the SoC 12 and/or the communication component 22 or storage memory 24. In some implementations, the first tile 404 may include self-testing logic, such as self-testing attached in an architecture similar to the second tile 306 of FIG. 3 or the second tile 406. In other implementations, the first tile 404 may not include any self-testing logic or may include self-testing logic that is powered by a primary power source, such as always on power source or source. The first tile 404 may include or correspond to a primary power domain or both the primary power domain and a second power domain. For example, the first tile 404 may only include functional logic of the first power domain and powered by the first power supply 450, or may include the functional logic and self-testing logic of a second power domain and powered by the second power supply 452.

As illustrated in FIG. 4, the second tile 406 includes a plurality of power domains for self-testing logic. For example, the second tile 406 includes multiple DFT wrapper tiles 432-438, and each wrapper tile may include one or more wrapper cells. To illustrate, a first DFT wrapper tile 432 includes at least one wrapper cell, such a DFT wrapper cell 442 as illustrated in the example of FIG. 4. Similarly, a second DFT wrapper tile 434 includes a second DFT wrapper cell 444, a third DFT wrapper tile 436 includes a third DFT wrapper cell 446, and a fourth DFT wrapper tile 438 includes a fourth DFT wrapper cell 448. The second tile 406 includes or corresponds both the primary power domain and the second power domain. For example, the second tile 406 includes functional logic of the first power domain and powered by the first power supply 450 and includes the self-testing logic of the second through fifth power domains and powered by the second through fifth power supplies 452-458.

The plurality of power supplies 408 includes distinct power supply 450-458, such as a first power supply 450, a second power supply 452, a third power supply 454, a fourth power supply 456, and a fifth power supply 458. The first power supply 450 may include or correspond to a functional power supply, such as primary or always-on power supply to supply power to a functional power domain, such as primary or always-on power domain. The second through fifth power supplies 452-458 may include or correspond to DFT or lesser-on power supplies as compared to the first power supply 450. For example, the second through fifth power supplies 452-458 may each power a corresponding power domain of the second through fifth power domains. A lesser-on power supply may include or correspond to a power supply that is not always on, and is only on for some modes, and/or on less than with respect to one or more other power supplies. As compared to the example of FIG. 3, the circuit architecture includes multiple dedicated DFT power supplies, and corresponding DFT power domains.

In the example of FIG. 4, the DFT wrapper cell logic of each DFT wrapper tile may correspond to a separate power domain which is powered by a separate, corresponding power supply. For example, the first tile 404 and other logical or functional tiles may be powered by a first power supply (e.g., a primary power supply, an always on power supply, etc.). Optionally, the first tile 404 is powered by one or more additional power supplies, such as one or more self-testing (e.g., DFT) power supplies.

The second tile 406 is powered by two or more power supplies. For example, the second tile 406 is powered by two or more self-testing (e.g., DFT) power supplies. In the example illustrated in FIG. 4, the first DFT wrapper tile 432 is powered by the second power supply 452, the second DFT wrapper tile 434 is powered by the third power supply 454, the third DFT wrapper tile 436 is powered by the fourth power supply 456, and the fourth DFT wrapper tile 438 is powered by the fifth power supply 458. In other examples, two or more DFT wrapper tiles may be powered by a same power supply and correspond to a same power domain. For example, the first DFT wrapper tile 432 and the second DFT wrapper tile 434 is powered by the second power supply 452, and the third DFT wrapper tile 436 and the fourth DFT wrapper tile 438 may be powered by the third power supply 454. In this manner, the second tile 406 may include two or more self-testing power domains powered by two or more self-testing power supplies.

During operation, the software control bus may coordinate or control functional operations by the tiles, DFT operations by the tiles, or a combination thereof. For example, the software control bus may activate the first power domain and/or control power delivery in the first power domain to power components for functional operations with power from the first power supply. As another example, the software control bus may activate multiple power domains (e.g., the first power domain and one or more of the second through fifth power domains) and/or control power delivery in the activated power domains to power components for self-testing operations, such as DFT, MBIST, and/or debugging operations, with power from multiple power supplies.

Although each of the DFT wrapper tiles are illustrated on a single tile, the second tile 406, in other implementations the DFT wrapper tiles of FIG. 4 and/or other DFT wrapper tiles may be included on other tiles, such as the first tile 404, another tile (e.g., a third tile), or other tiles. Additionally, or alternatively, different DFT wrapper tiles on different tiles may correspond to a same power domain and be powered by a same power supply (e.g., the second power supply 452) or correspond to different power domains and be powered by different power supplies (e.g., the second power supply 452 and a sixth power supply).

FIG. 4 also depicts an example 460 of the DFT wrapper cell 442 of the second tile 406. Specifically, the example 460 illustrates examples components, such as components 462 and 464 or logic of a DFT wrapper cell of a DFT wrapper tile. In the example 460 of the DFT wrapper cell 442 of the first DFT wrapper tile 432, the DFT wrapper cell 442 includes various type of logic, such as intest compressor/decompressor logic 462 and OB wrapper logic 464. Although the example 460 of FIG. 4 depicts a particular combination of components of a DFT wrapper cell for the DFT wrapper cell 442, a DFT wrapper cell may include other combinations of such components and other components in other examples. An additional example of a DFT wrapper cell is illustrated in FIG. 3, example 360, and examples of component level architecture for DFT wrapper tiles and cells are illustrated and described with reference to FIGS. 5-8. The compressor/decompressor logic 462 may include or correspond to compression logic for testing and may be configured to reduce data volume for testing operations. In some implementations, the compressor/decompressor logic 462 includes embedded deterministic test (EDT) logic.

Figure 5:
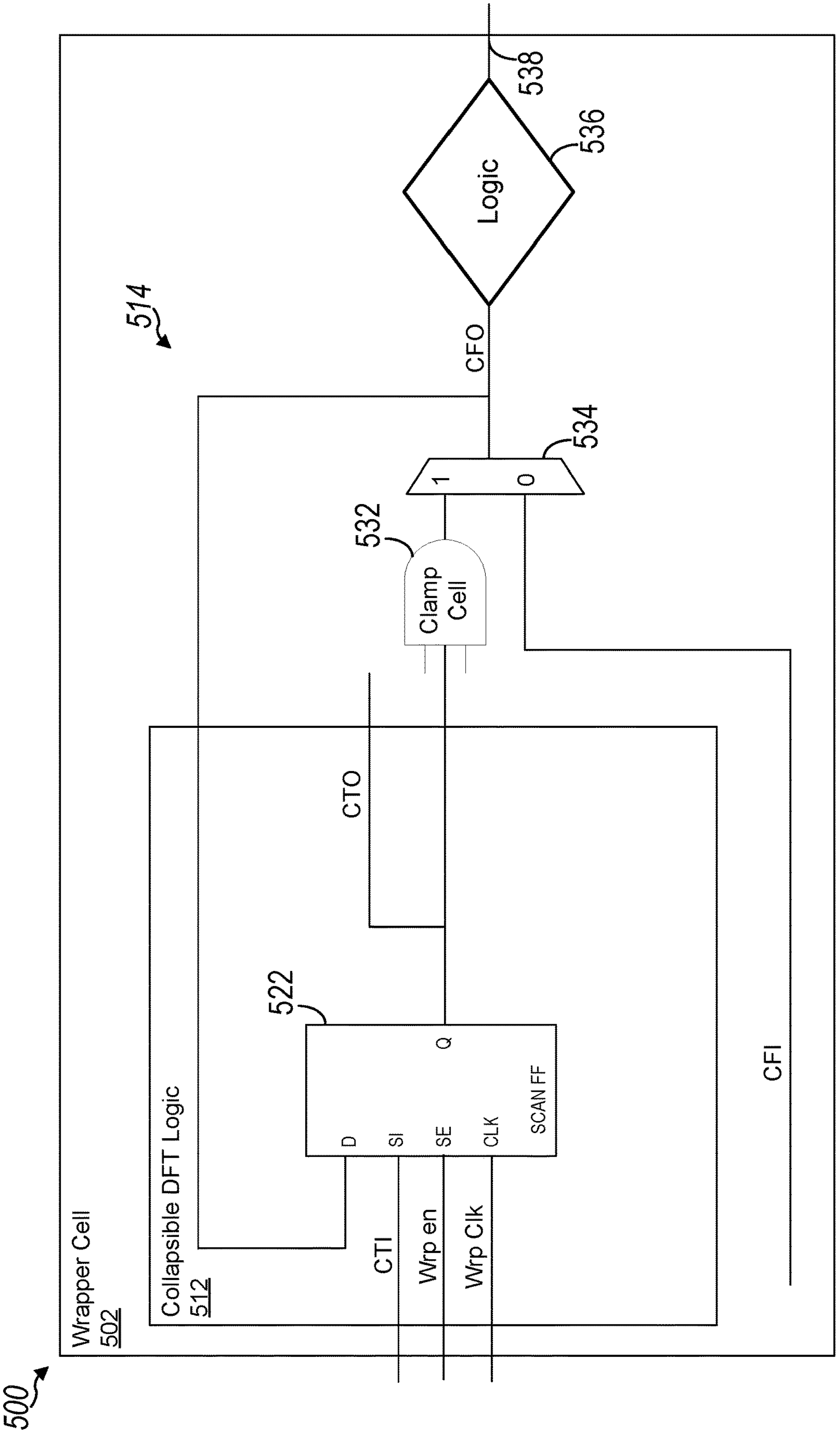
FIG. 5 is a block diagram illustrating an example of a split self-testing wrapper cell including power collapsible self-testing logic according to some aspects of the disclosure.
Figure 6:
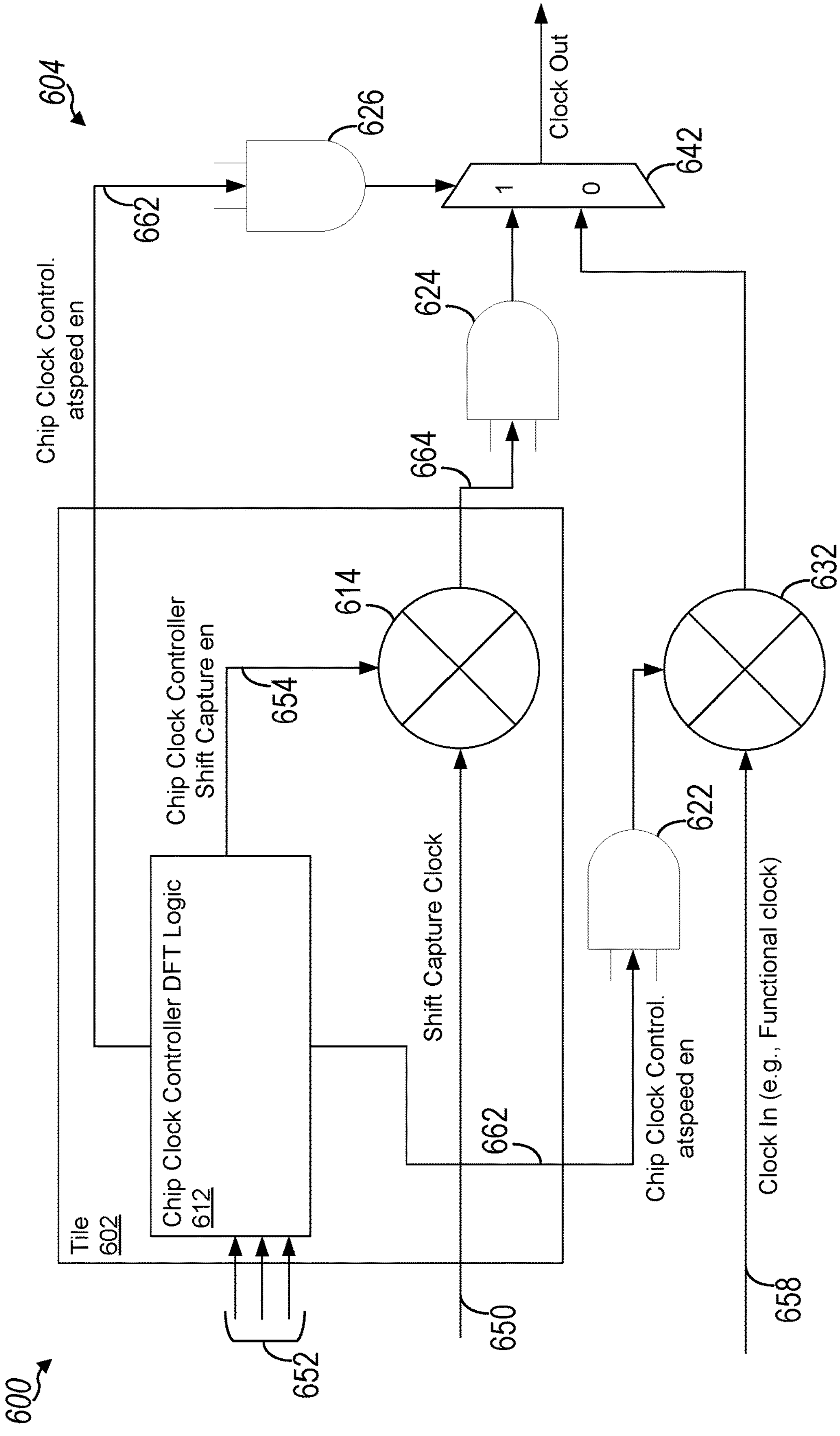
FIG. 6 is a block diagram illustrating an example of chip clock controller self-testing circuity including power collapsible self-testing logic according to some aspects of the disclosure.
Figure 7:
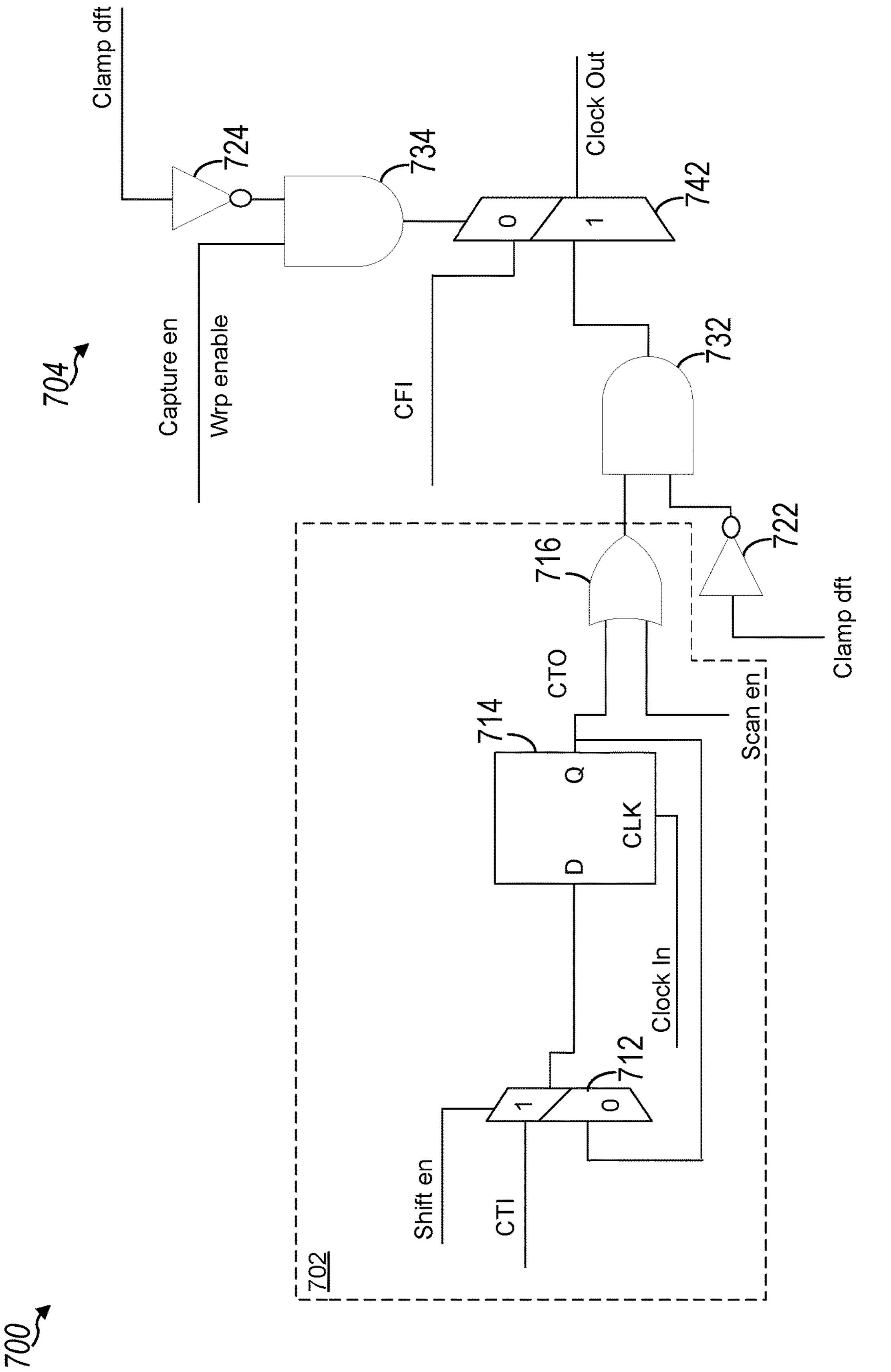
FIG. 7 is a block diagram illustrating an example of an always-on wrapper cell including power collapsible self-testing logic according to some aspects of the disclosure.

As compared to FIGS. 3 and 4 which illustrate overall architecture changes or improvements for self-testing logic, FIGS. 5-7 illustrate component level designs and changes or improvements for collapsible self-testing logic. For some tiles, cells, or logic, simply placing all self-testing circuitry in a second or non-primary power domain, such as a lesser or not always on power domain, may reduce testing functionality or prevent some operational or testing functionality altogether. For example, when DFT logic is used in connection with or for functional logic, powering off DFT logic may change or prevent some functional operations. Thus, to implement the overall architecture changes of dedicated or distributed self-testing power domains of improvements of FIGS. 3 and/or 4, the self-testing circuitry or self-testing related circuitry may need to be adjusted to ensure proper operation. For example, additional circuitry, additional signal routing, or both may be used to implement moving the self-testing logic from a primary power domain to a separate dedicated domain or to a lesser on domain (e.g., a not always on domain or a lesser on domain than the functional logic).

FIG. 5 is a block diagram 500 illustrating an example of a wrapper cell design of self-testing logic for functional logic. In FIG. 5, a wrapper cell design for self-testing logic is illustrated which supports collapsing or powering off self-testing logic. Block diagram 500 of FIG. 5 depicts a wrapper cell 502 which includes collapsible DFT logic 512 that is separate from dedicated powered-on logic 514 of the wrapper cell 502. In the example of FIG. 5, the collapsible DFT logic 512 of the wrapper cell 502 includes an integrated circuit 522. In the example illustrated in FIG. 5, the collapsible DFT logic 512 (e.g., the integrated circuit 522) may be controlled by and receive power from a second power supply which is collapsible and provides power for DFT operations, such as the second power supply 352 of FIG. 3 or the second power supply 452 of FIG. 4.

The collapsible DFT logic 512 is configured to perform self-testing operations for the functional logic 536, such as by supplying inputs to the functional logic 536, and optionally by providing feedback to the functional logic 536. As illustrated in the example of FIG. 5, the integrated circuit 522 is configured to receive various inputs and produce an output that is provided to the functional logic 536 via other logic of the wrapper cell 502, such as the dedicated powered-on logic 514, as described in further detail below.

The wrapper cell 502 also includes dedicated powered-on logic 514 (e.g., always on logic) which is part of a first power domain and powered by a first power supply, separate from the second power supply and second power domain. The first power domain may include or correspond to core or always on power domain, or to a power domain which is on or has more priority than the second power domain. As illustrated in the example of FIG. 5, the dedicated powered-on logic 514 includes a clamp cell 532, a multiplexer 534, and functional logic 536.

The clamp cell 532 may include or correspond to clamp circuitry, such as an AND gate, and may be configured to clamp a circuit or input line to a particular digital signal value and prevent signal drift. To illustrate, in the example depicted in FIG. 5, the clamp cell 532 may clamp an input to the multiplexer 534 to a digital high or value of one in the absence of an input, such as in the absence of the output from the integrated circuit 522 of the collapsible DFT logic 512.

The multiplexer 534 may be configured to provide or select between multiple different inputs to provide a single output. The functional logic 536 may include or correspond to logic for any of the operational or functions of a larger IC or SoC. Examples of functional logic include, but are not limited to, debugging logic, pipeline logic, SoC interconnect processor to memory connections, etc.

During a testing operation of or for the functional logic 526, power is supplied from both power supplies to the components of the wrapper cell 502 of FIG. 5. For example, the first and second power domains may be active or activated and receive power from a corresponding power supply, and the first and second power domains power on all of the components of the wrapper cell 502 with the power from the first and second power supplies. To illustrate, the first or primary power supply may provide power to the first or primary power domain and the functional components of the wrapper cell 502, such as dedicated powered-on logic 514. As illustrated in the example, of FIG. 5, the primary power supply and domain provide power to the clamp cell 532, the multiplexer 534, and the functional logic 536. The second power supply may provide power to the second power domain and to power the collapsible self-testing components of the wrapper cell 502, such as the collapsible DFT logic 512 and the integrated circuit 522 thereof.

During the testing operation of the functional logic 526, the collapsible DFT logic 512 is powered by the second power supply and receives various input signals, such as a cell function output (CFO) signal, a cell test input (CTI) signal, an integrity signal (e.g., a wrap integrity signal, wrapper en), a clock signal (e.g., a wrapper clock signal), etc., and generates an output signal, such as a cell test output (CTO) signal. The collapsible DFT logic 512 provides the output signals to the multiplexer 534 via the clamp cell 532. For example, the integrated circuit 522 has four inputs and a single output and receives a CFO signal which is fed back from the multiplexer 534 at a first input, the CTI signal at a second input, the integrity signal at a third input, and the cell clock signal at a fourth input. The integrated circuit 522 generates a first output of the CTO signal based on one or more of the received inputs, and provides the CTO signal to the clamp cell 532.

During the testing operation of the functional logic 526, the dedicated powered-on logic 514 of the wrapper cell 502 is powered by the first power supply and processes the received CTO signal from the collapsible DFT logic 512. For example, the clamp cell 532 receives the CTO signal and provides the CTO signal to the multiplexer 534. The multiplexer 534 also receives the CTO signal and also receives a second input, such as a functional input, cell function input (CFI) signal.

The multiplexer 534 outputs an output signal, the CFO signal, to the functional logic 536 and also to the integrated circuit 522 of the collapsible DFT logic 512, such as by feeding back the output to the CFO signal to the integrated circuit 522. The functional logic 536 receives the CFO signal, processes the CFO signal (e.g., performs a function thereon or using the CFO), and generates an output signal 538. The functional logic 536 can then be tested by analyzing or comparing the output of the functional logic 536 to one or more of the output of the integrated circuity, the CTO signal, the input to the functional logic, the CFO signal, or both. Alternatively, the CTO signal or the output signal 538 of the functional logic 536 may indicate the test results of the functional logic 536.

During the testing operation of the functional logic 536, the DFT components of the collapsible DFT logic 512 of the wrapper cell 502 are powered by the second power supply and enable testing of the functional logic 536. However, if the DFT components of the collapsible DFT logic 512 were to remain on or coupled to an active power supply during functional operation or outside of testing, the DFT components would leak power. However, with the architecture of the example of FIG. 5, the DFT components of the collapsible DFT logic 512 can be collapsed or powered off, such as disconnected from power or disconnected from power without using gates within the power domain, and the dedicated powered-on logic 514 of the wrapper cell 502 can function as normal in the first or primary power domain with power from the first or primary power supply even though it is located within a wrapper cell (e.g., wrapper cell 502) for self-testing. For example, the entire second power domain (e.g., a DFT power domain or a collapsible DFT power domain) may be disconnected from power, such as the second power supply. To illustrate, power may not be provided from the second power supply and routed through a software control bus to the self-testing logic of the second power domain, as illustrated and described with reference to FIGS. 2-4.

For example, during normal or functional operation of the functional logic 536 of the wrapper cell 502, only the primary or first power supply and domain may be active and the second power supply and domain are not active. Thus, the DFT components of the collapsible DFT logic 512 do not receive power and do not function the same as in the testing operation. The components of the dedicated powered-on logic 514, such as the clamp cell 532, the multiplexer 534, and the functional logic 536 thereof, receive power from the first power supply and generate two outputs similar to the testing operation. For example, the clamp cell 532 may produce a particular output signal or value, such as a signal with a digital high or value of one, and provide the signal to the multiplexer 534 in the absence of an input signal from the powered off collapsible DFT logic 512. To illustrate, the clamp cell 532 may prevent the input to the multiplexer 534 from fluctuating between high and low values and fix the value at a digital high (e.g., 1). The multiplexer 534 operates similar to its operation in the testing operation, but one of its inputs is now a set value and not a testing output signal. To illustrate, the multiplexer 534 receives two inputs, the input from the clamp cell 532 which is now a particular value instead of a test output signal, the CTO signal, and receives the CFI signal. The multiplexer 534 generates the CFO output signal based on the two received inputs and provides the CFO signal to the functional logic 536, and optionally to the collapsible DFT logic 512.

However, even when the CFO output is provided to (fed back to) the DFT circuitry of the collapsible DFT logic 512 which is not receiving power, no output signal is generated by the integrated circuit 522, the CTO signal, or provided to the clamp cell 532. Accordingly, the wrapper cell 502, such as the functional logic 536 thereof, will generate a functional output signal based on the received functional input signal, the CFI signal, because the CFO signal received by functional logic 536 and used for functional processing may correspond directly to the CFI signal. Thus, even though the functional logic 536 may receive and use the CFO signal, the CFO signal in normal operation corresponds to the CFI signal as the multiplexer 534 is configured to receive a particular signal or value from the clamp cell 532 in the absence of a test output being received from the collapsible DFT logic 512.

As compared to prior wrapper cells which are part of a single, primary power domain and served by a single power supply, the aspects described in FIG. 5 illustrate a modified wrapper cell with components from two power domains and served by two power supplies. Such aspects may enable wrapper cells to be used for functional logic or cells and include collapsible components to reduce power leakage.

FIG. 6 is a block diagram 600 illustrating an example of a chip clock controller design with collapsible self-testing logic. In FIG. 6, a split chip clock controller design with collapsible self-testing logic for chip clock controller logic is illustrated. The chip clock controller design may include or correspond to an on-chip clock controller (OCC) design in some implementations. Block diagram 600 of FIG. 6 depicts a tile 602 which includes chip clock controller logic. The chip clock controller logic may be used with a functional clock to enable DFT testing of a function or functions associated with the functional clock. For example, the chip clock controller logic may be used "on-top" of or around a functional clock to enable the creation of clock signal for DFT and/or for synchronizing DFT components or synchronizing DFT and functional components.

In the example of FIG. 6, the chip clock controller logic of the tile 602 includes chip clock controller DFT logic 612 and a mixer 614. In the example of FIG. 6, the chip clock controller logic (e.g., collapsible chip clock controller DFT logic) of the tile 602 is part of a second power domain and is controlled by and receives power a from second power supply (e.g., self-testing power domain or lesser-on power supply) which provides power to the second power domain for chip clock controller operations, such as chip clock controller DFT operations. The chip clock controller DFT logic 612 may include or correspond to finite state machine (FSM) logic for the chip clock controller logic of the tile 602.

The split chip clock controller design also includes separate DFT logic 604 (e.g., always-on or non-collapsible chip clock controller DFT logic), which is part of the first power domain and is controlled by and receives power from a first power supply (e.g., primary power supply) that provides power to some components of the split chip clock controller design for chip clock controller DFT operations. The separate DFT logic 604 includes clamp cells 622-626, mixer 632, and multiplexer 642. The clamp cells of the separate DFT logic 604 are configured to output a particular value, such as 1 or 0, in the absence of an input and prevent floating or fluctuation of the output signals provided to the mixer 632 and the multiplexer 642. When inputs are actively provided to the clamp cells, the clamp cells generate an output based on the received input signals, such as pass along the current high or low signal values.

Figure 8:
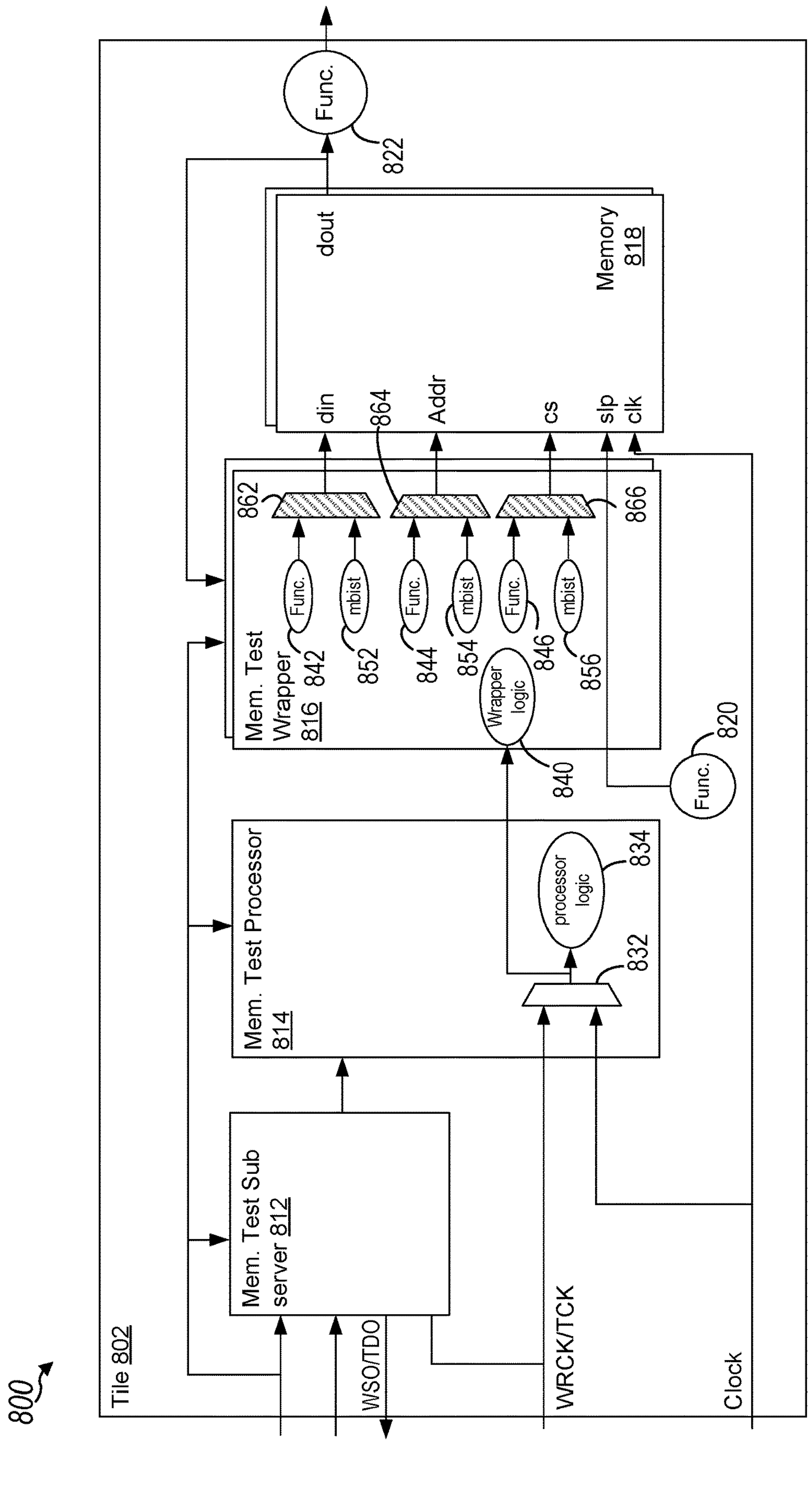
FIG. 8 is a block diagram illustrating an example of memory self-testing circuity including power collapsible self-testing logic according to some aspects of the disclosure.

As compared to the examples of FIGS. 5, 7, and 8, the power distinction or divide between components is not simply between DFT components and non-DFT components, but between dedicated powered-on DFT components (e.g., essential or necessary components for a particular design) and collapsible DFT components (e.g., not essential or necessary for a particular design).

During a testing operation of the chip clock controller logic, power is supplied to both power domains from both power supplies to power the components of the chip clock controller logic of FIG. 6. For example, the first and second power domains may be active or activated to power on all of the components of the chip clock controller logic with power received from the first and second power supplies. To illustrate, the second power supply (e.g., self-testing power supply) may power components of tile 602, such as the chip clock controller DFT logic 612 and the mixer 614, and corresponding to the second power domain. The first or primary power supply may power the DFT components of the separate DFT logic 604, which are part of the first power domain and are separate from the second power domain, such as the tile 602 and the collapsible chip clock controller/DFT logic thereof. For example, the first power supply may power the clamp cells 622-626, the mixer 632, and the multiplexer 642 of the first power domain.

During the testing operation, the chip clock controller logic of the tile 602 receives a clock signal 650 (e.g., shift capture clock signal) and one or more input signals 652, and generates two output signals, a first output signal 662 and a second output signal 664 each provided to a corresponding clamp cell of the separate DFT logic 604. For example, the chip clock controller DFT logic 612 receives one or more input signals 652 and generates two outputs, an intermediary output signal 652 (e.g., a shift capture en signal) and a first output signal 662 (e.g., a controller atspeed en signal), based on the one or more input signals 652, which may optionally include the clock signal 650 in some implementations. The intermediary output signal 654 is an intermediate output signal of the chip clock controller logic of the tile 602, and is provided to the mixer 614 for generation of the second output signal 664. To illustrate, the chip clock controller DFT logic 612 provides the intermediary output signal 654 to the mixer 614 for mixing with the clock signal 650 (e.g., the shift capture clock signal) to generate the second output signal 664. The second output signal 664 may correspond to a mixed shift capture clock and integrity signal which can be used for testing operations.

The first output signal 662 is an output of the tile 602 and is provided to multiple components of the separate DFT logic 604. For example, the chip clock controller DFT logic 612 provides the first output signal 662 to the first clamp cell 622 and to the third clamp cell 626. The second output signal 664 is another output of the tile 602 and is provided to the second clamp cell 624 of the separate DFT logic 604.

During the testing operation, the second and third clamp cells 624 and 626 of the separate DFT logic 604 each receive an input from the chip clock controller logic of the tile 602 and generate a corresponding output signal (with a particular value) to the multiplexer 642. For example, the second clamp cell 624 receives the second output signal 664, generates an output based on the second output signal 664, and provides the output to the multiplexer 642, and the third clamp cell 626 receives the first output signal 662, generates an output based on the first output signal 662, and provides the output to the multiplexer 642.

The separate DFT logic 604 also receives the first output signal 662 at the first clamp cell 622, which generates an output based on the first output signal 662 and provide the output to the mixer 632. The mixer 632 also receives a clock signal 658 (e.g., functional clock signal), which may be different from or the same as the clock signal 650 received by the tile 602. The mixer 632 generates an output based on the two received inputs, such as by mixing the two inputs to generate an output which is provided to the multiplexer 642. To illustrate, the mixer 632 mixes the received clock signal 650 (e.g., the functional clock signal) and the output from the first clamp cell 622, which is based on the first output signal 662 (e.g., the chip clock controller atspeed en signal), to generate an output (e.g., a mixed clock signal).

During the testing operation, the multiplexer 642 outputs a clock out signal, such as a digital signal with highs and lows for DFT operations for functional logic associated with the received clock signals or for functional operations based on the inputs received from the mixer 632 and from the second and third clamp cells 624 and 626. The split chip clock controller design enables the chip clock controller logic to be bifurcated into always on components and collapsible components of two different power domains even for chip clock controller or DFT related logic.

For example, during normal or functional operation, the chip clock controller/DFT logic of the tile 602 may be powered down and collapsed by deactivating the second power supply and domain to prevent leakage. However, as compared to conventional or non-split chip clock controller logic designs, the split chip clock controller design of FIG. 6 enables chip clock controller operation outside of chip clock controller DFT testing.

To illustrate, during normal or functional operation the chip clock controller/DFT logic of the tile 602 is power collapsed, and it does not output the first output signal 662 (e.g., the chip clock controller atspeed en signal) to the first and third clamp cells 622 and 626, nor does it output the second output signal 664 to the second clamp cell 624. The clamp cells 622-626 however still output a signal with a particular value, as they "clamp" their output to a digital high or low. During normal or functional operation, the clamp cells 622-626 provide their outputs similar to as described with reference to the testing operation. The digital value of the output signal may change because the output signal is no longer based on an input signal from the chip clock controller/DFT logic of the tile 602 which is power collapsed.

The mixer 632 also receives the clock signal 658 (e.g., functional clock signal) during normal or functional operation, and the mixer 632 generates an output based on the received clock signal 658 and the received output from the first clamp cell 622. The mixer 632 provides its output to the multiplexer 642. Similar to the normal or functional operation, the multiplexer 642 outputs the clock out signal for functional or normal operations based on the inputs received from the mixer 632 and from the second and third clamp cells 624 and 626.

As compared to previous chip clock controller logic designs which used a single, primary power supply and domain, such as an always on or core power supply and domain, the chip clock controller logic designs describe herein involve chip clock controller logic designs which include multiple power domains that are powered by multiple power supplies to enable the collapsing of a portion of the components of the chip clock controller logic.

FIG. 7 is a block diagram 700 illustrating an example of a wrapper cell design for collapsible self-testing logic. In FIG. 7, a wrapper cell design with collapsible self-testing logic for always-on power control logic is illustrated. Block diagram 700 of FIG. 7 depicts power control logic which includes power control circuitry (e.g., always-on power control circuitry). In the example of FIG. 7, the power control circuitry of the power control logic includes collapsible DFT power control logic 702 (also referred to as collapsible DFT logic 702 for short) and non-collapsible power control logic 704 (e.g., always-on logic). The collapsible DFT power control logic 702 includes a multiplexer 712, an integrated circuit 714, and an OR gate 716. In the example of FIG. 7, the collapsible DFT power control logic 702 is part of a second power domain and is controlled by and receives power from a second power supply that is separate from a first power domain and corresponding first power supply. The first power supply provides power to the first power domain for power control operations, such as power control operations which use all-or-nothing signals like clamp, save, restore, ret, reset, etc. The second power supply may include or correspond to a self-testing (e.g., DFT/MBIST and/or debugging) power supply, or a lesser on power supply, which can be deactivated to collapse the second power domain.

The non-collapsible power control logic 704 of the wrapper cell may include or correspond to DFT and power control logic which is part of the first power domain and separate from the collapsible DFT power control logic 702, and which is powered by the first power supply. As illustrated in the example of FIG. 7, the non-collapsible power control logic 704 includes inverters 722 and 724, the clamp cells 732 and 734, and the multiplexer 742. Similar to the separate DFT logic 604 of FIG. 6, the non-collapsible power control logic 704 of the wrapper cell may include or correspond to always-on DFT and/or power control logic or logic that is separate from a DFT power domain.

During a testing operation of the power control logic of the wrapper cell, power is supplied to power domains from both power supplies to the components of the wrapper cell of FIG. 7. For example, the first and second power domains may be active or activated to power on all of the components of the wrapper cell with power received from the first and second power supplies. To illustrate, the first or primary power supply may power the first power domain and the functional components of the wrapper cell, such as the non-collapsible power control logic of the wrapper cell. As illustrated in the example, of FIG. 7, the primary power supply provides power to the inverters 722 and 724, the clamp cells 732 and 734, and the multiplexer 742.

The second power supply provides power to the second power domain and the collapsible self-testing logic of the wrapper cell, such as the collapsible DFT logic 702. As illustrated in the example of FIG. 7, the second power supply provides power to the multiplexer 712, the integrated circuit 714, and the OR gate 716.

During the testing operation of the power control logic, the collapsible DFT logic 702 is powered by the second power supply and receives various input signals, such as CTI, shift en, scan en, etc., and generates an output signal via the OR gate 716. The collapsible DFT logic 702 provides the output signal to the multiplexer 742. For example, the collapsible DFT logic 702 provides the output to an input of the multiplexer 742 via other DFT components of the non-collapsible power control logic 704.

During the testing operation of the power control logic, the components of the non-collapsible power control logic 704 of the wrapper cell are powered by the first power supply and process the output from the collapsible DFT logic 702. For example, the first clamp cell 732 receives the output from the collapsible DFT logic 702 and receives an input from the first inverter 722, which is generated based on a received DFT clamp signal. The first clamp cell 732 outputs a signal to the multiplexer 742 (e.g., always-on DFT multiplexer) based on the two received signals.

The multiplexer 742 may receive a second input, CFI signal, and may also receive a third input from the second clamp cell 734. Similar to the first clamp cell 732, the second clamp cell 734 may receive a first input from a second inverter 724 based on a DFT clamp signal. The second clamp cell 734 may also receive a second signal, such as wrapper enable signal.

During the testing operation of the power control logic, the components of the collapsible DFT logic 702 of the wrapper cell are powered by the second power supply and enable testing of the power control logic and wrapper cell. However, if the DFT components of the collapsible DFT logic 702 were to remain on during functional operation or outside of testing, the DFT components of the collapsible DFT logic 702 would leak power. However, with the architecture of the example of FIG. 7, some DFT components of the power control logic can be collapsed or powered off, such as disconnected from power or disconnected from power with using gates, and the non-collapsible power control logic 704 can function as normal in the primary power domain with power from the primary power supply even though it is located within a wrapper cell for self-testing that includes DFT components of a separate power domain powered by a separate power supply.

For example, during normal or functional operation of the power control logic of the wrapper cell, only the primary or first power supply and domain may be active and the second power supply is not active. Thus, the second power domain and the DFT components of the collapsible DFT logic 702 are collapsed and do not receive power and do not function the same as in the testing operation. The components of the collapsible DFT logic 702, the multiplexer 712, the integrated circuit 714, and the OR gate 716, do not receive power from the second power supply and do not generate an output via the OR gate 716 that is provided to the non-collapsible power control logic 704. However, the non-collapsible power control logic 704 does receive power and functions similar to the testing operation, with the exception of not receiving the output from the collapsible DFT logic 702, that is the output from the OR gate 716. Accordingly, the wrapper cell, such as the multiplexer 744 thereof, may generate an always on clock output, such as a digital signal with a value of one.

As compared to prior wrapper cells which include a single power domain and are served by a single power supply, the aspects described in FIG. 7 illustrate a modified wrapper cell that includes two power domains served by two power supplies. Such aspects may enable wrapper cells with collapsible DFT logic to be used for power cells, such as always on power cells, with reduced power leakage.

FIG. 8 is a block diagram 800 illustrating an example of self-testing logic for memory architecture. In FIG. 8, MBIST architecture is illustrated for self-testing memory circuitry and/or cells. Block diagram 800 of FIG. 8 depicts tile 802 which includes memory circuitry, such as memory cells and self-testing circuitry. In the example of FIG. 8, a plurality of multiplexers are part a first power domain and receive power from a first power supply, which provides power to the memory cells and which is separate from a second power domain and a corresponding second power supply which provides power to the rest of the self-testing components of the tile 802 (e.g., the second power domain).

The tile 802 includes memory test sub server logic 812, memory test processor logic 814, memory test wrapper 816, and memory 818. The memory test sub server logic 812, the memory test processor logic 814, and the memory test wrapper 816 may include or correspond to self-testing logic for the memory 818, such as MBIST circuitry.

The memory test sub server logic 812, the memory test processor logic 814, and the memory test wrapper 816 may be configured to perform a self-testing operation or operations on the memory 818. For example, the memory test sub server logic 812 may control or provide inputs to the memory test processor logic 814, which may control or provide inputs into the memory test wrapper 816 for memory self-testing operations. The memory test wrapper 816 (e.g., memory test wrapper cell or memory test wrapper logic) may control or provide inputs into the memory 818 for both testing and functional operations. The memory 818 may be configured to store data, such as read and write data.

As illustrated in the example of FIG. 8, the memory test processor logic 814 includes a multiplexer 832 and processor logic 834. The multiplexer 832 may receive a wrapper clock signal (e.g., WRCK/TCK) and a clock signal and generate an output based on the received signals. The multiplexer 832 may be configured to provide the output (e.g., a multiplexed clock signal) to the processor logic 834 and the memory test wrapper 816, such as wrapper logic 840 thereof. The processor logic 834 may be configured to process the output.

As illustrated in the example of FIG. 8, the memory test wrapper 816 includes the wrapper logic 840, functional logic 842-846, and self-testing logic, such as MBIST logic 852-856. The wrapper logic 840 receives the output from the memory test processor logic 814 and may control operations of the memory test wrapper 816 based on the output. The functional logic and/or self-testing logic may generate outputs, such as based on or under the control of the wrapper logic 840, and provide the outputs to corresponding multiplexers. For example, a first functional logic 842 and a first MBIST logic 852 may each provide a corresponding output to a corresponding first multiplexer 862, a second functional logic 844 and a second MBIST 854 logic may each provide a corresponding output to a corresponding second multiplexer 864, and a third functional logic 846 and a third MBIST logic 856 may each provide a corresponding output to a corresponding third multiplexer 866. The multiplexers 862-866 are configured to provide an output to a corresponding input of the memory 818 based on the received signal or signals.

As compared to conventional MBIST architectures with a single power domain, the MBIST architecture example of FIG. 8 may includes collapsible self-testing logic and includes multiple power domains that are powered by multiple power supplies. In such conventional MBIST architecture, the multiplexers 862-866 are within the memory test wrapper 816 and are powered by a primary power supply. In the example of FIG. 8, the multiplexers 862-866 are part of the first power domain and powered by the primary power supply, and the rest of the self-testing logic is part of the second power domain and powered by the second power supply. Additionally, although the multiplexers 862-866 are illustrated as part of the memory test wrapper 816, in some implementations the multiplexers 862-866 may be located outside of the memory test wrapper 816, such as on the tile 802 in its own logic or with other logic, such the memory 818.

The tile 802 may also include one or more other functional logic for performing one or more functions of the tile 802, such as memory functions (e.g., read, write, etc.), self-testing functions, debugging functions etc. As illustrated in the example of FIG. 8, the tile 802 includes first function logic 820 and second function logic 822.

During a testing operation of tile 802, power is supplied from both power supplies to the components of tile 802. For example, the first and second power supplies may be active or activated to power on all of the components of tile 802. To illustrate, the first or primary power supply may power functional components and only select DFT components (e.g., always on multiplexers, multiplexers 862-866). As illustrated in the example, of FIG. 8, the primary power supply provides power to the functions of the tile 802, functional logic 820, 822, and 842-846, the multiplexers 862-866, and the memory 818. The second power supply provides power to the second power domain. The second power domain may include the self-testing or MBIST circuitry of the tile 802, such as the memory test sub server logic 812, the memory test processor logic 814, and the memory test wrapper 816, except for the multiplexers 862-866 and functional logic thereof (e.g., functional logic 842-846).

As illustrated in FIG. 8, the second power supply may only provide power to the second power domain and select self-testing components, and may not provide power to the first power domain and the multiplexers embedded in the self-testing components or associated with the self-testing components, such as the multiplexers 862-866 of or associated with the memory test wrapper 816. Instead, the primary power supply provides the power to such multiplexers of the first power domain, because if such were powered down during functional operation the memory circuitry may not function or may lose some functionality, that is the memory 818 would not receive inputs from the multiplexers 862-866.

During the testing operation of tile 802, various external signals are received at the memory test sub server logic 812 and the memory test processor logic 814, and the memory test sub server logic 812 and the memory test processor logic 814 process the input signals to provide various output signals to control and perform memory self-testing. For example, the memory test sub server logic 812 may receive one or more clock signals or clock signal related inputs, integrity signals (en signals), register related signals, scan related signals, or a combination thereof, and may output test data (e.g., wrapper data out (WDO) or test data out (TDO)) to other circuits and memory test control signals to the memory test processor logic 814 based on one or more of the received signals to control and coordinate memory self-testing operations. The memory test sub server logic 812 may interface between the memory test processor logic 814 and other DFT components.

The memory test sub server logic 812 may provide an output signal to the memory test processor logic 814, such as for the processor logic 834 thereof, to control and/or coordinate the self-testing operations of the memory test processor logic 814 and the memory test wrapper 816. The memory test processor logic 814 may receive the output signal from the memory test sub server logic 812 and other input signals, and provide an output signal to wrapper logic 840 of the memory test wrapper 816. For example, a multiplexer 832 may receive a wrapper clock signal (e.g., WRCK/TCK) and a clock signal and output a modified or multiplexed clock signal to processor logic 824 and to the wrapper logic 840 of the memory test wrapper 816. The processor logic 824 may control operations of the memory test processor logic 814, and optionally one or more of the memory test wrapper 816 and the memory 818, based on the modified or multiplexed clock signal, the input from the memory test sub server logic 812, and one or more external inputs.

The memory test wrapper 816 may generate one or more functional outputs from one or more functional logic thereof. The outputs of the functional logic may be provided to a corresponding multiplexer, which also receives a testing input, such as from corresponding MBIST logic. The multiplexers 862-866 produce an output which is provided to the memory 818, such as to various corresponding inputs of the memory for testing. The memory 818 may generate an output or outputs on one or more of the inputs.

During operation of the tile 802, such as functional or memory operation, power is supplied from a single power supply to the select components of tile 802. For example, power from a second power supply, such as dedicated testing (e.g., DFT or MBIST) power supply or a lesser on power supply, is not supplied to the second power domain, such as the memory test sub server logic 812, the memory test processor logic 814, and the memory test wrapper 816. Power from the first power supply, such as functional domain or memory power supply, may be suppled to the memory and select components of the memory test wrapper 816. To illustrate, power from the first power supply is provided to the functional logic 842-846 and to the multiplexers 862-866 of the memory test wrapper 816 to enable an output to be provided to the inputs of the memory 818.

As compared to conventional DFT or MBIST designs, less DFT/MBIST components are included in a primary or functional power domain. For example, in some implementations only the multiplexers 862-866 of the MBIST circuitry/logic are in the primary or functional power domain and receive power from the primary or functional power supply (e.g., memory test, memory, or functional power supply). The rest of the DFT/MBIST circuitry and logic is in a second power domain (e.g., DFT/collapsible power domain), which receives power from the second power supply, and can be collapsed during normal operation (e.g., disconnected form the second power supply).

During the functional operation of the tile 802, power is suppled from the primary power supply to the primary power domain. To illustrate, power is supplied to the functional logic 820 and 822 of the tile 802, the functional logic 842-846 of the memory test wrapper 816, the multiplexers 862-866 of the memory test wrapper 816, and the memory 818. The functional logic 842-846 of the memory test wrapper 816 may generate outputs which are provided to the multiplexers 862-866. As the multiplexers 862-866, which are also used for DFT operations, are used in normal operation the multiplexers are designed to receive power from the primary power supply (e.g., part of the primary power domain). The multiplexers 862-866, receiving power from the primary power supply, are able to generate an output, such as an output based on or corresponding to the input from a corresponding functional logic of the functional logic 842-846.

As compared to the testing operation, the multiplexers 862-866 may not receive a testing input from MBIST logic 852-856, and as such may not be powered on. The multiplexers 862-866 provide outputs to the memory 818 for functional operation, such as reading data, writing data, status check, etc.

Accordingly, the built in self-testing circuitry can be collapsed (e.g., powered off) and may have no leakage or less power leakage as compared to circuit designs which include all testing components on a main power domain or primary power domains.

Figure 9:
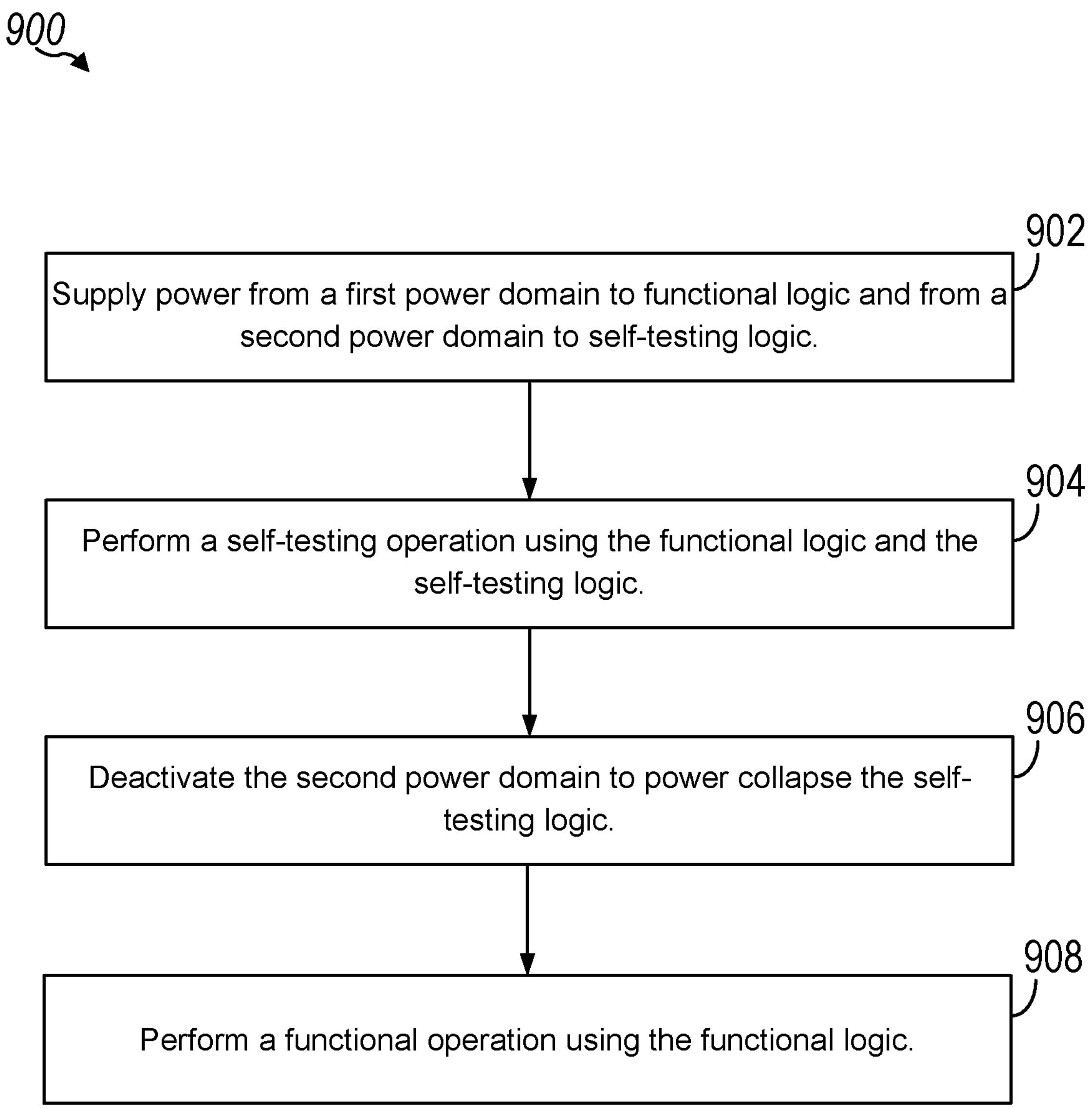
FIG. 9 is a flow chart illustrating a method for power collapsing self-testing logic according to some aspects of the disclosure.

FIG. 9 is a flow chart illustrating a method for power collapsing self-testing logic according to some embodiments of the disclosure. In some implementations, the method may be performed by the SoC 12 of FIG. 1 or the circuit architecture of any of FIGS. 2-8. For example, the power control logic 216 of the software control bus 202 of FIG. 2, the power control logic 324 of the software control bus 302 of FIG. 3, or the power control logic 424 of the software control bus 402 of FIG. 4 may control and power collapse the DFT logic of any of FIGS. 2-8. The DFT logic may include the DFT logic 212, the DFT wrapper logic 222, and/or the DFT wrapper logic 232 of FIG. 2, the DFT wrapper tile 332 of FIG. 3, any of the DFT wrapper tiles 432-438 of FIG. 8, the wrapper cell 502 of FIG. 5, the chip clock controller logic of the tile 602 of FIG. 6, the wrapper cell of FIG. 7 (e.g., the collapsible DFT power control logic 702 thereof), or the tile 802 of FIG. 8 (e.g., MBIST circuitry/logic thereof).

A method 900 includes, at block 902, supplying power from a first power domain to functional logic and from a second power domain to self-testing logic. The first power domain may include or correspond to an always-on power domain, such as the first power domain, powered by an always-on power supply (e.g., AOSS), such as the AOSS 208 of FIG. 2, the first power supply 350 of FIG. 3, or the first power supply 450 of FIG. 4. The second power domain may include or correspond to a collapsible power domain, such as any of the second through fifth power domains, powered by a secondary or alternative power supply, such as the second power supply 352 of FIG. 3, or any of the secondary power supplies of FIG. 4 (e.g., second through fifth power supplies 452-458). For example, a software control bus activates power supplies and power domains to supply power via a first power domain to functional logic and via a second power domain to self-testing logic, as described with reference to FIGS. 2-8. To illustrate, the power control logic 324, 424 connects (e.g., opens a gate) the first power domain to the first power supply and the second power domain to the second power supply to provide first power to the first power domain from the first power supply 350, 450, and to provide second power to the second power domain from the second power supply 352, 452 (or one of the other alternative power domains of FIG. 4). The first power domain distributes the received first power to the functional logic 330, 430 of the first tile 304, 404, and the second power domain distributes the received second power to the second tile 306, 406.

At block 904, method 900 includes performing a self-testing operation using the functional logic and the self-testing logic. The self-testing operation may include or correspond to a DFT or MBIST operation, such as a DFT operation for the DFT logic of FIG. 3 or 4, the functional logic 536 of FIG. 5, the clock controller of FIG. 6, the always-on power logic of FIG. 7, or the memory of FIG. 8. For example, the software control bus performs a self-testing operation using the functional logic and the self-testing logic, as described with reference to FIGS. 2-8. To illustrate, the power control logic 324, 424 performs a self-test operation on the DFT logic of the second tile 306, 406 or the DFT logic of FIGS. 5-8, such as clock signal self-test, a memory cell self-test, etc.

At block 906, method 900 includes deactivating the second power domain to power collapse the self-testing logic. For example, the software control bus deactivates the second power domain to power collapse the self-testing logic, as described with reference to FIGS. 2-8. To illustrate, the power control logic 324, 424 may completely turn off the second power supply 352 of FIG. 3 or one or more of the auxiliary or secondary power supplies of FIG. 4, such as the second through fifth power supplies 452-458 of FIG. 4, or disconnect (e.g., close a gate) the second power domain from the second power supply, after performance of the self-testing operation, such as testing operations after or associated with manufacturing.

At block 908, method 900 includes performing a functional operation using the functional logic. The functional operation may include or correspond to any non-self testing operation, or any non-initial self-testing operation (e.g., DFT or MBIST) In some implementations, the functional operation includes or corresponds to a debugging or calibration operation that can be performed periodically after a chip or SoC has passed initial manufacturing tests to improve operations. For example, the software control bus (e.g., the power control logic thereof) may control functional operations during normal SoC and/or device operation by providing power from the primary or always-on power domain. To illustrate, the power control logic 324, 424 may control functional operations during normal SoC and/or device operation by providing power from the first power supply 350, 450 to components of the first power domain. As the testing power domains may be completely turned off or disconnected from corresponding power supplies, the SoC and device experience less power loss from the testing logic while still having full operational functionality and testing functionality.

Operations of the logic of FIGS. 2-8 or the method 900 of FIG. 9 may be performed by a user equipment (UE), such as a UE described with reference to FIG. 10. For example, example operations (also referred to as "blocks") of the logic of FIGS. 2-8 or method 900 may enable UE 1015 (e.g., a wireless communication device) to support power collapsing self-testing logic to reduce self-testing logic power drain during normal SoC operation (e.g., during non-self-testing operations).

Figure 10:
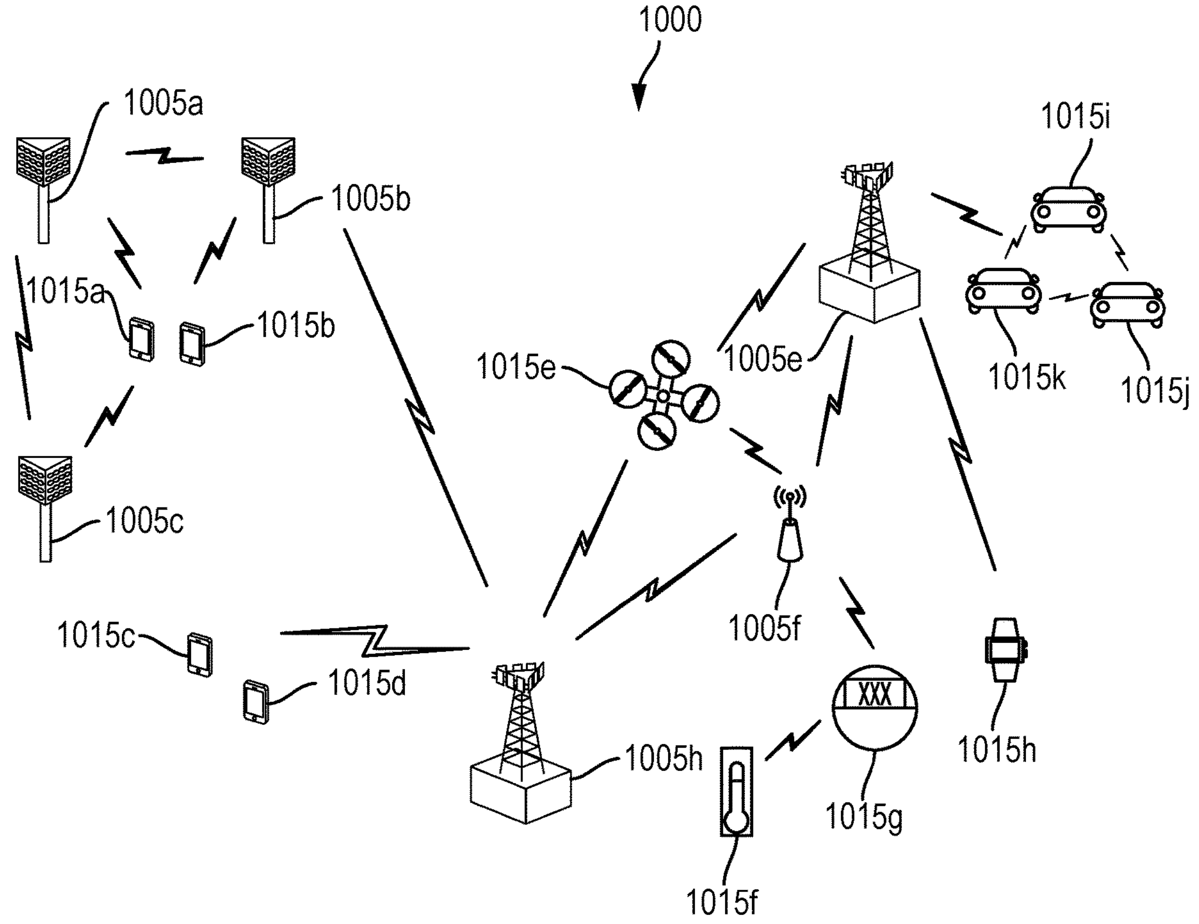
FIG. 10 is a block diagram illustrating details of an example wireless communication system according to one or more aspects of the disclosure.

FIG. 10 is a block diagram illustrating details of an example wireless communication system according to one or more aspects. The wireless communication system may include wireless network 1000. Wireless network 1000 may, for example, include a 5G wireless network. As appreciated by those skilled in the art, components appearing in FIG. 10 are likely to have related counterparts in other network arrangements including, for example, cellular-style network arrangements and non-cellular-style-network arrangements (e.g., device to device or peer to peer or ad hoc network arrangements, etc.).

Wireless network 1000 illustrated in FIG. 10 includes a number of base stations 1005 and other network entities. A base station may be a station that communicates with the UEs and may also be referred to as an evolved node B (eNB), a next generation eNB (gNB), an access point, and the like. Each base station 1005 may provide communication coverage for a particular geographic area. In 3GPP, the term "cell" may refer to this particular geographic coverage area of a base station or a base station subsystem serving the coverage area, depending on the context in which the term is used. In implementations of wireless network 1000 herein, base stations 1005 may be associated with a same operator or different operators (e.g., wireless network 1000 may include a plurality of operator wireless networks). Additionally, in implementations of wireless network 1000 herein, base station 1005 may provide wireless communications using one or more of the same frequencies (e.g., one or more frequency bands in licensed spectrum, unlicensed spectrum, or a combination thereof) as a neighboring cell. In some examples, an individual base station 1005 or UE 1015 may be operated by more than one network operating entity. In some other examples, each base station 1005 and UE 1015 may be operated by a single network operating entity.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 10, base stations **1005*d* and 1005*e* are regular macro base stations, while base stations 1005*a*-1005*c* are macro base stations enabled with one of 3 dimension (3D), full dimension (FD), or massive MIMO. Base stations 1005*a*-1005*c* take advantage of their higher dimension MIMO capabilities to exploit 3D beamforming in both elevation and azimuth beamforming to increase coverage and capacity. Base station 1005*f*** is a small cell base station which may be a home node or portable access point. A base station may support one or multiple (e.g., two, three, four, and the like) cells.

Wireless network 1000 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 1015 are dispersed throughout the wireless network 1000, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 1015, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a flying device, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 1015*a*-1015*d* of the implementation illustrated in FIG. 10 are examples of mobile smart phone-type devices accessing wireless network 1000. A UE may also be a machine specifically configured for connected communication, including machine type communication (MTC), enhanced MTC (eMTC), narrowband IoT (NB-IoT) and the like. UEs 1015*e*-1015*k* illustrated in FIG. 10 are examples of various machines configured for communication that access wireless network 1000.

A mobile apparatus, such as UEs 1015, may be able to communicate with any type of the base stations, whether macro base stations, pico base stations, femto base stations, relays, and the like. In FIG. 10, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 1000 may occur using wired or wireless communication links.

In operation at wireless network 1000, base stations 1005*a*-1005*c* serve UEs 1015*a* and 1015*b* using 3D beamforming and coordinated spatial techniques, such as coordinated multipoint (CoMP) or multi-connectivity. Macro base station 1005*d* performs backhaul communications with base stations 1005*a*-1005*c*, as well as small cell, base station 1005*f*. Macro base station 1005*d* also transmits multicast services which are subscribed to and received by UEs 1015*c* and 1015*d*. Such multicast services may include mobile television or stream video, or may include other services for providing community information, such as weather emergencies or alerts, such as Amber alerts or gray alerts.

Wireless network 1000 of implementations supports mission critical communications with ultra-reliable and redundant links for mission critical devices, such UE 1015*e*, which is an aeronautical vehicle. Redundant communication links with UE 1015*e* include from macro base stations 1005*d* and 1005*e*, as well as small cell base station 1005*f*. Other machine type devices, such as UE 1015*f* (thermometer), UE 1015*g* (smart meter), and UE 1015*h* (wearable device) may communicate through wireless network 1000 either directly with base stations, such as small cell base station 1005*f*, and macro base station 1005*e*, or in multi-hop configurations by communicating with another user device which relays its information to the network, such as UE 1015*f* communicating temperature measurement information to the smart meter, UE 1015*g*, which is then reported to the network through small cell base station 1005*f*. Wireless network 1000 may also provide additional network efficiency through dynamic, low-latency TDD communications or low-latency FDD communications, such as in a vehicle-to-vehicle (V2V) mesh network between UEs 1015*i*-1015*k* communicating with macro base station 1005*e*.

In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, 5$^{th}$ Generation (5G) or new radio (NR) networks (sometimes referred to as "5G NR" networks, systems, or devices), as well as other communications networks. As described herein, the terms "networks" and "systems" may be used interchangeably. A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards. A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long-term evolution (LTE) is a release of UMTS that uses E-UTRA. The various different network types may use different radio access technologies (RATs) and RANs.

In some implementations, devices of wireless network 1000 may include or access a memory system, such as a flash memory system, described above with reference to FIGS. 1-8. As non-limiting examples, UEs 1015 may include or correspond to host device 102 of FIGS. 1 and 3, and memory system 110 of FIGS. 1 and 3 may include or correspond to storage devices that are integrated in UEs 1015 or that are removably coupled to UEs 1015, such as a SSD, a MMC, an eMMC, a RS-MMC, a micro-MMC, a SD card, a mini-SD, a micro-SD, a USB storage device, a UFS device, a CF card, a SM card, or a memory stick. Additionally, or alternatively, base stations 1005 may include or correspond to host device 102 of FIGS. 1 and 3, and memory system 110 of FIGS. 1 and 3 may include or correspond to storage devices that are integrated in base stations 1005 or that are removably coupled to base stations 1005, such as a SSD, a MMC, an eMMC, a RS-MMC, a micro-MMC, a SD card, a mini-SD, a micro-SD, a USB storage device, a UFS device, a CF card, a SM card, or a memory stick.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail devices or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-10 include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

Those of skill in the art that one or more blocks (or operations) described with reference to FIGS. 1-10 may be combined with one or more blocks (or operations) described with reference to another of the figures. For example, one or more blocks (or operations) of FIG. 1 may be combined with one or more blocks (or operations) of FIG. 3. As another example, one or more blocks associated with FIG. 1 may be combined with one or more blocks (or operations) associated with FIG. 4 or 5. Additionally, or alternatively, one or more operations described above with reference to FIGS. 1-4 may be combined with one or more operations described with reference to FIGS. 5-10. Additionally, or alternatively, one or more operations of methods described herein may be performed in a different order than described. For example, operations of method 900 of FIG. 9 may be performed out of order or in a different order than shown in FIG. 9.

In a first aspect, a system-on-a-chip (SoC), includes: functional logic configured to perform one or more functions; self-testing logic configured to perform a self-testing operation on the functional logic; a plurality of power domains, including a functional power domain coupled to the functional logic and configured to provide power to the functional logic and a self-testing power domain coupled to the self-testing logic and configured to provide power to the self-testing logic; and power control logic configured to control power delivery from the plurality of power domains to the functional logic and the self-testing logic and configured to power collapse the self-testing logic.

In a second aspect, alone or in combination with one or more of the above aspects, the plurality of power domains includes a second self-testing power domain, and wherein the self-testing power domain and the second self-testing power domain are included on a same tile of the SoC.

In a third aspect, alone or in combination with one or more of the above aspects, the functional power domain is an always-on power domain, and wherein the self-testing power domain is a lesser-on power domain.

In a fourth aspect, alone or in combination with one or more of the above aspects, the functional power domain is a collapsible power domain, and wherein the self-testing power domain is a collapsible design-for-testing (DFT) power domain.

In a fifth aspect, alone or in combination with one or more of the above aspects, the plurality of power domains only includes a single self-testing power domain for the SoC.

In a sixth aspect, alone or in combination with one or more of the above aspects, the functional logic and the self-testing logic are included on a same tile of the SoC.

In a seventh aspect, alone or in combination with one or more of the above aspects, the self-testing logic includes built-in self-testing (BIST) logic, design for test (DFT) logic, debugging logic, or a combination thereof.

In an eighth aspect, alone or in combination with one or more of the above aspects, the power control logic configured to power collapse the self-testing logic includes to: power collapse first self-testing logic of a split design wrapper cell; power collapse second self-testing logic of a chip clock controller circuit; power collapse third self-testing logic an always-on wrapper cell; power collapse fourth self-testing logic of a memory circuit; or any combination thereof.

In a ninth aspect, alone or in combination with one or more of the above aspects, the SoC further includes: a split wrapper cell including the functional logic and the self-testing logic, wherein the split wrapper cell includes: power collapsible self-testing logic coupled to the self-testing power domain; and clamp circuitry, a multiplexer, and the functional logic coupled to the functional power domain.

In a tenth aspect, alone or in combination with one or more of the above aspects, the SoC further includes: chip clock controller circuitry including the functional logic and the self-testing logic, wherein the chip clock controller circuitry includes: power collapsible self-testing logic coupled to the self-testing power domain; and non-power collapsible logic coupled to the functional power domain, wherein the non-power collapsible logic includes a clamp circuity, a mixer, and a multiplexer.

In an eleventh aspect, alone or in combination with one or more of the above aspects, the SoC further includes: an always-on wrapper cell including the functional logic and the self-testing logic, wherein the always-on wrapper cell includes: power collapsible self-testing logic coupled to the self-testing power domain; and non-power collapsible logic coupled to the functional power domain, wherein the non-power collapsible logic includes inverter circuity, clamp circuitry, and a multiplexer.

In a twelfth aspect, alone or in combination with one or more of the above aspects, the SoC further includes: a memory circuit including the functional logic and the self-testing logic, wherein the memory circuit includes: power collapsible self-testing logic coupled to the self-testing power domain; and memory logic and multiplexers coupled to the functional power domain.

In a thirteenth aspect, alone or in combination with one or more of the above aspects, a device includes: a processing system; and a memory coupled to the processing system, wherein the processing system is configured to cause the device to: supply power from a first power domain to functional logic and from a second power domain to self-testing logic; perform a self-testing operation using the functional logic and the self-testing logic; deactivate the second power domain to power collapse the self-testing logic; and perform a functional operation using the functional logic.

In a fourteenth aspect, alone or in combination with one or more of the above aspects, the processing system configured to deactivate the second power domain to power collapse the self-testing logic includes to: power collapse first self-testing logic of a split design wrapper cell; power collapse second self-testing logic of a chip clock controller circuit; power collapse third self-testing logic an always-on wrapper cell; power collapse fourth self-testing logic of a memory circuit; or any combination thereof.

In a fifteenth aspect, alone or in combination with one or more of the above aspects, the SoC further includes: the first power domain is an always-on power domain, and wherein the second power domain is a dedicated self-testing power domain or a lesser-on power domain.

In a sixteenth aspect, alone or in combination with one or more of the above aspects, the processing system is further configured to cause the device to: supply power from the first power domain to second functional logic; supply power from a third power domain to second self-testing logic; perform a second self-testing operation using the second functional logic and the second self-testing logic; deactivate the third power domain to power collapse the second self-testing logic; and perform a functional operation using the second functional logic.

In a seventeenth aspect, alone or in combination with one or more of the above aspects, the third power domain is a dedicated self-testing power domain or a lesser-on power domain of set of distributed self-testing power domains.

In an eighteenth aspect, alone or in combination with one or more of the above aspects, the processing system is further configured to cause the device to: supply power from the first power domain to second functional logic; supply power from the second power domain to second self-testing logic; perform a second self-testing operation using the second functional logic and the second self-testing logic; and perform, after deactivation of the second power domain, a second functional operation using the second functional logic.

In a nineteenth aspect, alone or in combination with one or more of the above aspects, the second power domain is a sole dedicated self-testing power domain or a lesser-on power domain for built in testing and debugging logic.

In a twentieth aspect, alone or in combination with one or more of the above aspects, supplying power from a first power domain to functional logic and from a second power domain to self-testing logic; performing a self-testing operation using the functional logic and the self-testing logic; deactivating the second power domain to power collapse the self-testing logic; and performing a functional operation using the functional logic.

In the above aspects, the power domains may include or correspond to a group of components (e.g., logic/circuitry) which are all powered by a particular power supply. The power domain may include components which are configured to provide or distribute power received from the power supply throughout the power domain, such as a common power rail and a common ground rail, which provide/distribute power to the other components of the power domain.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single-or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, which is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, opposing terms such as “upper” and “lower” or “front” and back” or “top” and “bottom” or “forward” and “backward” are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term “or,” when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, “or” as used in a list of items prefaced by “at least one of” indicates a disjunctive list such that, for example, a list of “at least one of A, B, or C” means A or B or C or AB or AC or BC or ABC (that is A and B and C) or any of these in any combination thereof. The term “substantially” is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term “substantially” may be substituted with “within [a percentage] of” what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A system-on-a-chip (SoC), comprising:

functional logic configured to perform one or more functions;

self-testing logic configured to perform a self-testing operation on the functional logic;

a plurality of power domains, including a functional power domain coupled to the functional logic and configured to provide power to the functional logic and a self-testing power domain coupled to the self-testing logic and configured to provide power to the self-testing logic;

second self-testing logic coupled to the self-testing logic and configured to perform the self-testing operation on the functional logic with the self-testing logic, wherein the functional power domain is further coupled to the second self-testing logic and configured to provide power to the second self-testing logic, wherein the self-testing logic and the second self-testing logic are included with the functional logic in a wrapper cell; and power control logic configured to control power delivery from the plurality of power domains to the functional logic, the self-testing logic and the second self-testing logic and configured to power collapse the self-testing logic.

2. The SoC of claim 1, wherein the plurality of power domains includes a second self-testing power domain, and wherein the self-testing power domain and the second self-testing power domain are included on a same tile of the SoC.

3. The SoC of claim 1, wherein the functional power domain is an always-on power domain, and wherein the self-testing power domain is a lesser-on power domain.

4. The SoC of claim 1, wherein the functional power domain is a collapsible power domain, and wherein the self-testing power domain is a collapsible design-for-testing (DFT) power domain.

5. The SoC of claim 1, wherein the plurality of power domains includes no more than one self-testing power domain for the SoC.

6. The SoC of claim 1, wherein the functional logic, the self-testing logic, and the second self-testing logic are included on a same tile of the SoC.

7. The SoC of claim 1, wherein the self-testing logic includes built-in self-testing (BIST) logic, design for test (DFT) logic, debugging logic, or a combination thereof.

8. The SoC of claim 1, wherein the power control logic configured to power collapse the self-testing logic includes to:

power collapse first self-testing logic of a split design wrapper cell;

power collapse third self-testing logic of a chip clock controller circuit;

power collapse fourth self-testing logic of an always-on wrapper cell;

power collapse fifth self-testing logic of a memory circuit; or any combination thereof.

9. The SoC of claim 1, wherein the wrapper cell comprises a split wrapper cell, and further comprising:

the split wrapper cell including the functional logic, the self-testing logic and the second self-testing logic, wherein the self-testing logic includes power collapsible self-testing logic coupled to the self-testing power domain and wherein the second self-testing logic includes clamp circuitry and a multiplexer coupled to the functional power domain.

10. The SoC of claim 1, wherein the wrapper cell comprises chip clock controller circuitry, and further comprising:

the chip clock controller circuitry including:

the self-testing logic comprising power collapsible self-testing logic coupled to the self-testing power domain; and the second self-testing logic comprising non-power collapsible logic coupled to the functional power domain, wherein the non-power collapsible logic includes a clamp circuity, a mixer, and a multiplexer.

11. The SoC of claim 1, wherein the wrapper cell comprises an always-on wrapper cell, and further comprising:

the always-on wrapper cell including:

the self-testing logic comprising power collapsible self-testing logic coupled to the self-testing power domain; and the second self-testing logic comprising non-power collapsible logic coupled to the functional power domain, wherein the non-power collapsible logic includes inverter circuity, clamp circuitry, and a multiplexer.

12. The SoC of claim 1, wherein the wrapper cell comprises a memory test wrapper, and further comprising:

a memory circuit including the memory test wrapper, wherein the memory test wrapper includes:

the self-testing logic comprising power collapsible self-testing logic coupled to the self-testing power domain;

the functional logic comprising memory logic; and the second self-testing logic comprising multiplexers coupled to the functional power domain.

13. A device comprising:

a processing system; and a memory coupled to the processing system, wherein the processing system is configured to cause the device to:

supply power from a first power domain to functional logic to second self-testing logic and from a second power domain to self-testing logic;

perform a self-testing operation using the functional logic, the self-testing logic, and the second self-testing logic, wherein the self-testing logic and the second self-testing logic are included with the functional logic in a wrapper cell;

deactivate the second power domain to power collapse the self-testing logic; and perform a functional operation using the functional logic and the second self- testing logic.

14. The device of claim 13, wherein the processing system configured to deactivate the second power domain to power collapse the self-testing logic includes to:

power collapse first self-testing logic of a split design wrapper cell;

power collapse third self-testing logic of a chip clock controller circuit;

power collapse fourth self-testing logic of an always-on wrapper cell;

power collapse fifth self-testing logic of a memory circuit; or any combination thereof.

15. The device of claim 13, wherein the processing system is further configured to cause the device to:

supply power from the first power domain to second functional logic;

supply power from a third power domain to third self-testing logic, wherein the third power domain is a dedicated self-testing power domain or a lesser-on power domain of set of distributed self-testing power domains;

perform a second self-testing operation using the second functional logic and the third self-testing logic;

deactivate the third power domain to power collapse the third self-testing logic; and perform a second functional operation using the second functional logic.

16. The device of claim 13, wherein the processing system is further configured to cause the device to:

supply power from the first power domain to second functional logic;

supply power from the second power domain to third self-testing logic;

perform a second self-testing operation using the second functional logic and the third self-testing logic; and perform, after deactivation of the second power domain, a second functional operation using the second functional logic.

17. A method comprising:

supplying power from a first power domain to functional logic and to second self-testing logic and from a second power domain to self-testing logic;

performing a self-testing operation using the functional logic, the self-testing logic, and the second self-testing logic, wherein the self-testing logic and the second self-testing logic are included with the functional logic in a wrapper cell;

deactivating the second power domain to power collapse the self-testing logic; and performing a functional operation using the functional logic and the second self-testing logic.

18. The SoC of claim 1, wherein the functional power domain is separate from the self-testing power domain, and wherein the power control logic is configured to power collapse the self-testing logic while providing power to the functional power domain and to non-power collapsible self-testing logic including the second self-testing logic.

19. The SoC of claim 1, wherein the second self-testing logic corresponds to a portion of circuity of the wrapper cell and comprises one or more of clamp circuity, a mixer, a multiplexer, or inverter circuity.

20. The SoC of claim 1, wherein the second self-testing logic is not power collapsed with the self-testing logic.

* * * * *